(12) United States Patent
Nakamura

(10) Patent No.: US 7,732,347 B2
(45) Date of Patent: Jun. 8, 2010

(54) SEMICONDUCTOR DEVICE AND FABRICATION PROCESS OF SEMICONDUCTOR DEVICE

(75) Inventor: Makoto Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 837 days.

(21) Appl. No.: 11/338,878

(22) Filed: Jan. 25, 2006

(65) Prior Publication Data

US 2006/0194450 A1    Aug. 31, 2006

(51) Int. Cl.
*H01L 21/31* (2006.01)
*H01L 21/469* (2006.01)

(52) U.S. Cl. .............................. 438/778; 257/E21.243

(58) Field of Classification Search .............. 257/340, 257/E21.253, E21.243; 438/778
See application file for complete search history.

(56) References Cited

U.S. PATENT DOCUMENTS

| | | | |
|---|---|---|---|
| 6,514,808 B1 * | 2/2003 | Samavedam et al. | 438/197 |
| 6,573,197 B2 * | 6/2003 | Callegari et al. | 438/791 |
| 6,632,729 B1 * | 10/2003 | Paton | 438/535 |
| 6,764,898 B1 * | 7/2004 | En et al. | 438/240 |
| 6,818,516 B1 * | 11/2004 | Lo et al. | 438/287 |
| 6,941,956 B2 * | 9/2005 | Osawa et al. | 134/61 |
| 7,037,845 B2 * | 5/2006 | Brask et al. | 438/710 |
| 2002/0163039 A1 * | 11/2002 | Clevenger et al. | 257/340 |
| 2003/0022432 A1 | 1/2003 | Hobbs et al. | |
| 2003/0045062 A1 * | 3/2003 | Puchner | 438/303 |
| 2003/0045080 A1 * | 3/2003 | Visokay et al. | 438/591 |
| 2003/0057504 A1 * | 3/2003 | Muraoka et al. | 257/410 |
| 2003/0104706 A1 * | 6/2003 | Mitsuhashi et al. | 438/756 |
| 2003/0230549 A1 * | 12/2003 | Buchanan et al. | 216/41 |
| 2003/0232506 A1 * | 12/2003 | Metzner et al. | 438/761 |
| 2004/0147101 A1 * | 7/2004 | Pomarede et al. | 438/591 |
| 2005/0269648 A1 * | 12/2005 | Basceri et al. | 257/410 |

FOREIGN PATENT DOCUMENTS

| | | |
|---|---|---|
| JP | 01-283936 A | 11/1989 |
| JP | 2002-75972 | 3/2002 |
| JP | 2003-174009 | 6/2003 |
| WO | WO 03/012850 | 2/2003 |

OTHER PUBLICATIONS

International Technology Roadmap for Semiconductors—Front End Processes, 2001 Edition. Cited in the specification.
Office Action dated Jan. 19, 2010 issued in corresponding Japanese Patent Application No. 2005-507407.
Research Disclosure dated Jun. 1989.

* cited by examiner

*Primary Examiner*—Kiesha R Bryant
*Assistant Examiner*—Igwe U Anya
(74) *Attorney, Agent, or Firm*—Westerman, Hattori, Daniels & Adrian, LLP

(57) ABSTRACT

A method of fabricating a semiconductor device on a Si substrate includes a first step of forming an insulation film containing an oxide of Zr or Hf on a Si substrate, a second step of forming a gate electrode film on the insulation film, a third step of patterning the gate electrode film by an etching process, a fourth step of annealing, after the third step, the insulation film in a processing gas ambient containing halogen, and a fifth step of removing the insulation film applied with the annealing process.

5 Claims, 20 Drawing Sheets

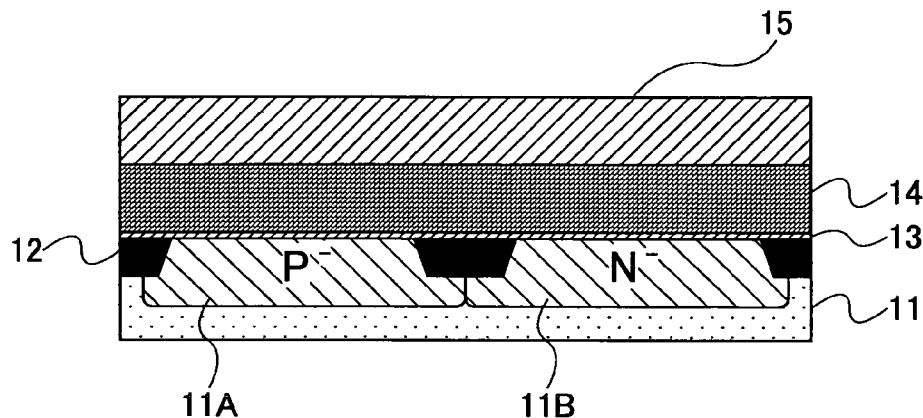
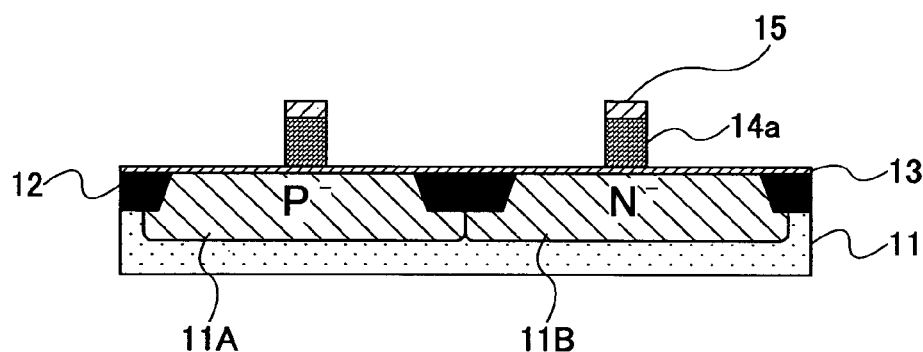
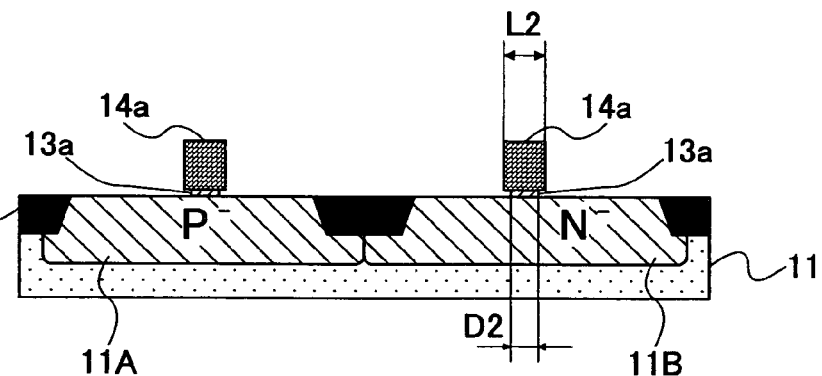

SEMICONDUCTOR DEVICE AND FABRICATION PROCESS OF SEMICONDUCTOR DEVICE

CROSS-REFERENCE TO RELATED APPLICATIONS

The present invention is a continuation application filed under 35 U.S.C. 111(a) claiming benefit under 35 U.S.C. 120 and 365(c) of PCT application JP2003/009927 filed on Aug. 5, 2003, the entire contents of each are incorporated herein as reference.

BACKGROUND OF THE INVENTION

The present invention generally relates to semiconductor devices and fabrication process of semiconductor devices, and more particularly to a highly miniaturized high-speed semiconductor device and the fabrication process thereof.

With progress in the art of miniaturization process, it is now becoming possible, in the technology of ultra-fast semiconductor devices, to fabricate a semiconductor device having the gate length of 0.1 μm or less.

Generally, the operational speed of a semiconductor device increases with device miniaturization, while it is necessary with such highly miniaturized semiconductor devices to reduce the thickness of the gate insulation film with decrease of the gate length achieved by the device miniaturization in accordance with scaling law.

FIGS. 1A-1D show the process of forming a gate electrode according to a conventional process of fabricating semiconductor devices.

First, an insulation film 102 is formed on a substrate 101 of Si in a step shown in FIG. 1A, and a gate electrode 103 of polysilicon, or the like, is formed on the insulation film 102 in the step shown in FIG. 1B.

Next, in the step of FIG. 1C, the gate electrode film 103 is etched to form a gate electrode 103a, and a gate insulation film 102a is formed by patterning the insulation film 102 in the step shown in FIG. 1D.

For the gate insulation film 102a, a silicon oxide film ($SiO_2$ film) has been used conventionally.

Now, when the gate length L0 is decreased to 0.1 μm or less, it becomes necessary to set the thickness TH0 of the gate insulation film to 1-2 nm or less in the case $SiO_2$ is used for the gate insulation film, while there arises a problem of increase in the tunneling current with a gate insulation film of such an extremely small thickness, and it is not possible to avoid the problem of increase of gate leakage current with such a structure.

In view of these situations, there is a proposal of using a so-called high-K dielectric material, which has a specific dielectric constant much larger than that of an $SiO_2$ film and thus has a small $SiO_2$-equivalent film thickness in spite of the fact that the physical thickness of the film itself is large, for the gate insulation film. By using such high-K dielectrics, it becomes possible to suppress the gate leakage current caused by tunneling effect as a result of the use of the gate insulation film of the thickness of 2-5 nm also in the case the semiconductor device is a ultra-miniaturized semiconductor device having a gate length of 0.1 μm or less.

Patent Reference 1

SIA, EECA, EIAJ, KSIA and TSIA, "International Technology Road Map for Semiconductors" in 2001 update However, such a high-K dielectric material has a nature entirely different form that of the conventionally used $SiO_2$ film, and thus, it is not possible to apply a conventional etching process to the etching process of such a high-K dielectric material.

For example, there arises a difficulty in that etching rate becomes extremely small when such a conventional etching process is applied to a high-K dielectric film. Further, there arises a problem that it is difficult to secure sufficient etching selectivity with regard to the substrate, and it becomes difficult to control the etching process as desired.

Further, because of such poor controllability of etching, it was not possible to pattern the gate insulation properly, while this leads to the problem of degradation of performance of the semiconductor device.

SUMMARY OF THE INVENTION

It is the object of the present invention to provide a novel and useful fabrication process of a semiconductor device wherein the foregoing problems are eliminated as well as the semiconductor device fabricated according to such a fabrication process.

Another and more specific object of the present invention is to provide a fabrication process of a semiconductor device capable of improving etching controllability of a high-K dielectric material used for gate insulation film.

Another object of the present invention is to provide a semiconductor device having a gate insulation film of a high-K dielectric material patterned with proper pattern shape.

In a first aspect, the present invention provides a method of fabricating a semiconductor device, comprising:

a first step of forming an insulation film containing an oxide of Zr or Hf over a Si substrate;

a second step of forming a gate electrode film over said insulation film;

a third step of patterning said gate electrode film by an etching process, a fourth step of annealing, after said third step, said insulation film in a processing gas ambient containing halogen; and a fifth step of removing said insulation film applied with said annealing process.

According to the present invention, etching controllability is improve when forming a gate insulation film by using a high-K dielectric material, by improving the etching rate of the insulation film that contains the high-K oxide of Zr or Hf.

In another aspect, the present invention provides a method of fabricating a semiconductor device, comprising:

a first step of forming an insulation film containing an oxide of Zr or Hf over a Si substrate;

a second step of forming a gate electrode film over said insulation film;

a third step of patterning said gate electrode film by an etching process;

a fourth step, conducted after said third step, of processing said insulation film by radicals of a processing gas containing a halogen; and a fifth step of removing said insulation film processed with said fourth step.

According to the present invention, it becomes possible to improve the etching controllability at the time of forming a gate insulation film by a high-K dielectric material, by improving the etching rate of the high-K insulation film containing an oxide of Zr or Hf.

In another aspect, the present invention provides a semiconductor device, comprising:

a Si substrate;

a device region over said Si substrate, and a field effect transistor formed over said device region, said field effect transistor including: a gate insulation film formed over said device region, said gate insulation region containing any of an oxide of Zr or an oxide of Hf; and a gate electrode formed over said gate insulate film, wherein said gate insulation film has a length smaller than a gate length of said gate electrode in a direction from a first side to a second side of said device region, a distance from an edge of said gate insulation film at said first side to an edge of said gate electrode at said first side being generally identical with a film thickness of said gate insulation film.

In another aspect, the present invention provides a method of fabricating a semiconductor device, comprising:

a first step of forming an insulation film containing any of a Hf oxide or Hf oxynitride containing any of Al or Si over a Si substrate;

a second step of forming a gate electrode film over said insulation film;

a third step of etching said gate electrode film; and a fourth step, after said third step, of processing said Si substrate with a processing liquid, wherein there is provided a thermal annealing step before said fourth step of annealing said insulation film to a temperature equal to or higher than a temperature used forming said gate electrode film in said second step.

According to the present invention, it becomes possible to improve etching controllability when forming a gate insulation film of high-K dielectric material, by conducting the thermal annealing process of the insulation film containing a high-K material of Hf oxide or Hf oxynitride containing Al or Si.

In a further aspect, the present invention provides a semiconductor device, comprising:

a Si substrate;

a device region over said Si substrate; and a field effect transistor formed over said device region, said field effect transistor comprising:

a gate insulation film containing an oxide of Hf containing Al or Si formed over said device region; and a gate electrode formed over said gate insulation film, said gate insulation film having a length in a direction from a first side to a second side of said device region smaller than a gate length of said gate electrode, a distance from an edge of said gate insulation film at said first side to an edge of said gate electrode at said first edge being generally identical with a film thickness of said gate insulation film.

BRIEF DESCRIPTION OF THE DRAWINGS

FIGS. 6A-6K are diagrams showing the fabrication process of a semiconductor device including therein a CMOS device that uses a gate insulation film of a high-K dielectric material;

DETAILED DESCRIPTION OF THE PREFERRED EMBODIMENT

Next, the present invention will be described for embodiments with reference to the attached drawings.

First Embodiment

Figure 1A:
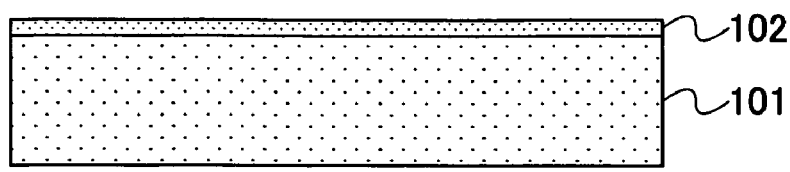
FIGS. 1A-1D are diagrams showing a conventional fabrication process of a semiconductor device.
Figure 1B:
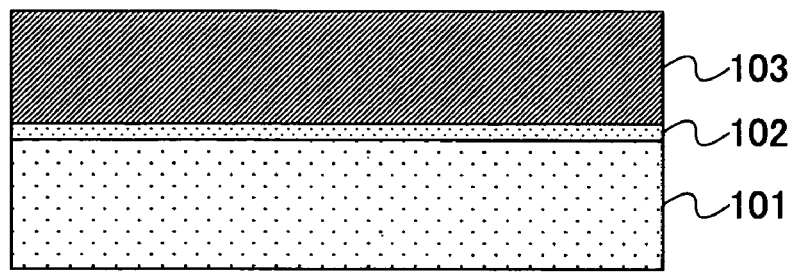
Figure 1C:
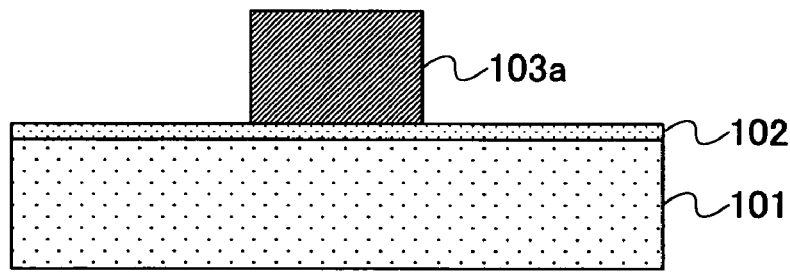
Figure 1D:
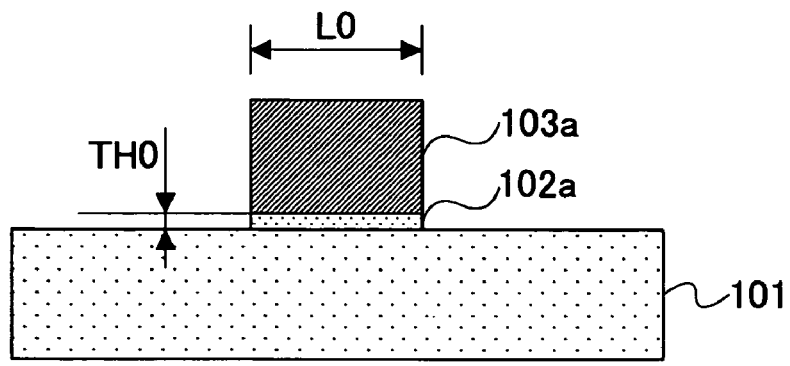
Figure 2A:
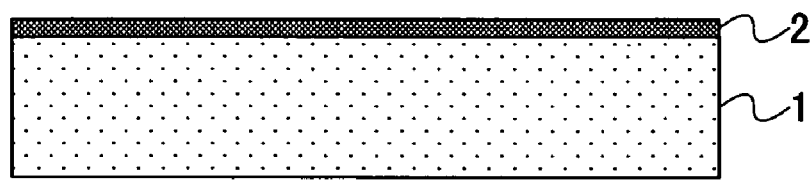
FIGS. 2A-2C are diagrams showing the fabrication process of a semiconductor device having a gate insulation film of a high-K dielectric material.
Figure 2B:
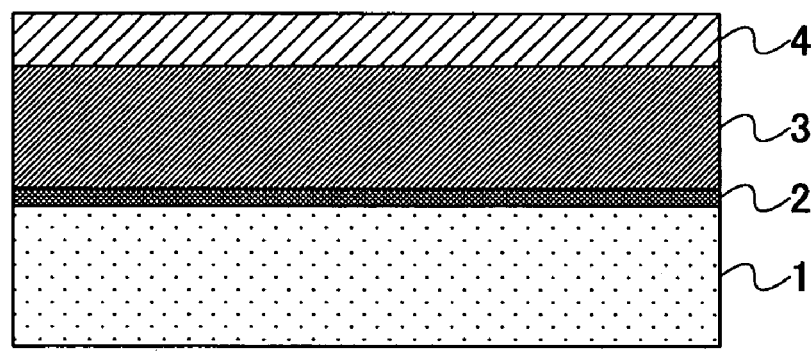
Figure 2C:
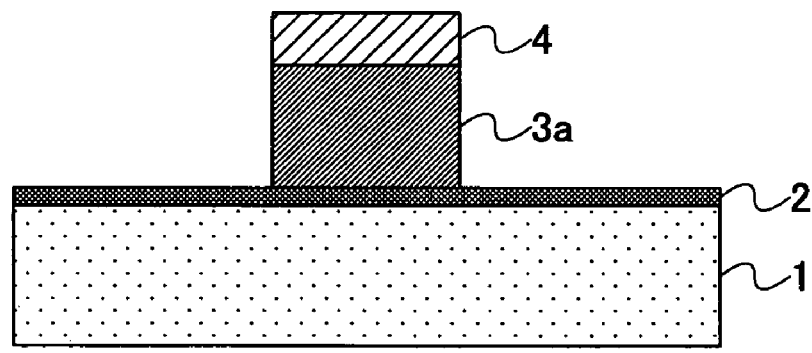

FIG. 2A-2C are diagrams showing the fabrication process of a semiconductor device that uses a gate insulation film of a high-K dielectric material according to a related art of the present invention.

First, a surface of a substrate 1 of Si, for example, is treated in a step of FIG. 2A by a preprocessing process, and an insulation film 2 of a high-K dielectric material such as $HfO_2$ is formed on a device region defined by a device isolation structure not illustrated.

Next, in the step of FIG. 2B, a gate electrode film 3 of polysilicon, or the like, is formed on the insulation film 2, wherein the polysilicon film is formed at a temperature of about 600° C. Further, a silicon oxide ($SiO_2$) film 4 is formed as a hard mask film for patterning the polysilicon film by an etching process.

Next, in the step of FIG. 2C, the gate electrode 3 is subjected to an etching process, wherein the etching process is conducted such that etching of the hard mask film 4 is conducted at first while using a resist pattern formed on the hard mask film 4 as a mask to form a hard mask pattern, and etching of the gate electrode film 3 is conducted by an RIE (reactive ion etching) process that uses a Br compound gas while using the patterned hard mask film 4 as a mask pattern. With this, a gate electrode 3a is formed.

Now, it should be noted that the insulation film 2 experiences heating at the time of formation of the gate electrode film, which is conducted at the temperature of about 600° C., while such heating induces crystallization in the insulation film 2 and there arises a problem that etching of the insulation film 2 becomes difficult.

When such crystallization has been caused, there arises a problem in that the etching rate becomes extremely slow when the etching process is conducted by an ordinary RIE process that uses a Br gas. On the other hand, with such a conventional etching process, the etching proceeds suddenly when the substrate is exposed. Further, etching rate is extremely slow with such crystallized insulation film also in the case of a wet etching process that uses an etchant of inorganic acid, or the like. Thus, there has been a difficulty of etching the insulation film 2.

Hereinafter, the fabrication process of a semiconductor device according to a first embodiment of the present invention that includes the process of etching a highly crystallized high-K dielectric film will be explained with reference to FIGS. 3A-3E, wherein those parts corresponding to the parts described previously are designated by the same reference numerals and the description thereof will be omitted.

Figure 3A:
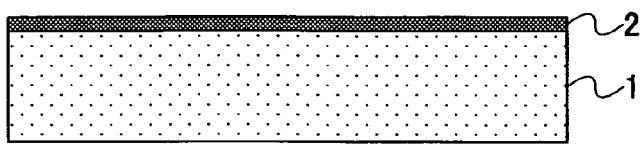
FIGS. 3A-3E are further diagrams showing the fabrication process of a semiconductor device having a gate insulation film of a high-K dielectric material.

First, the surface of the substrate 1 of Si, or the like, is treated by a preprocessing process in the step of FIG. 3A, and a high-K dielectric film 2 such as an $HfO_2$ film is deposited on the device region of the substrate 1 with a thickness of 3 nm by ALD (atomic layer deposition: called also ALCVD) process or MOCVD (metal-organic CVD) process. In ALD process, plural source gases are supplied intermittently and alternately to form a high-quality film on the substrate ideally one atomic layer by one atomic layer, or one molecular layer by one molecular layer. In an MOCVD process, film formation is conducted by a CVD (chemical vapor deposition) process while using a metal organic source.

Figure 3B:
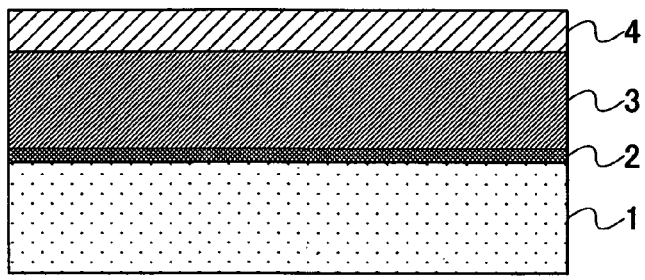

Next, in the step of FIG. 3B, a gate electrode film 3 of polysilicon is formed on the insulation film 2 with a thickness of 100 nm, wherein the polysilicon film 3 is formed at the temperature of 600-650° C., and a hard mask film 4 of silicon oxide ($SiO_2$) is formed thereon with the thickness of 50 nm as the hard mask for etching the polysilicon film 3.

Figure 3C:
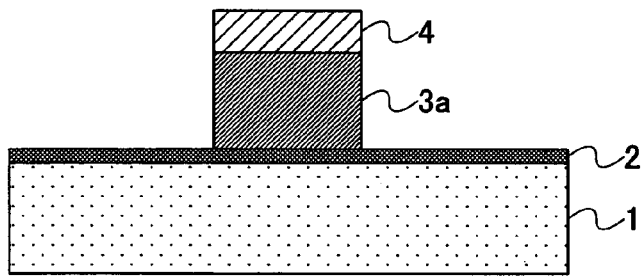

Next, in the step of FIG. 3C, etching of the gate electrode film 3 is conducted, wherein the etching process is conducted by patterning the hard mask film 4 while using a resist pattern formed on the hard mask film 4 as a mask and by applying an RIE process that uses an etching gas of a Br compound to the gate electrode film 3 while the hard mask film 4 thus patterned as a mask. With this, a gate electrode 3a is formed.

Figure 3D:
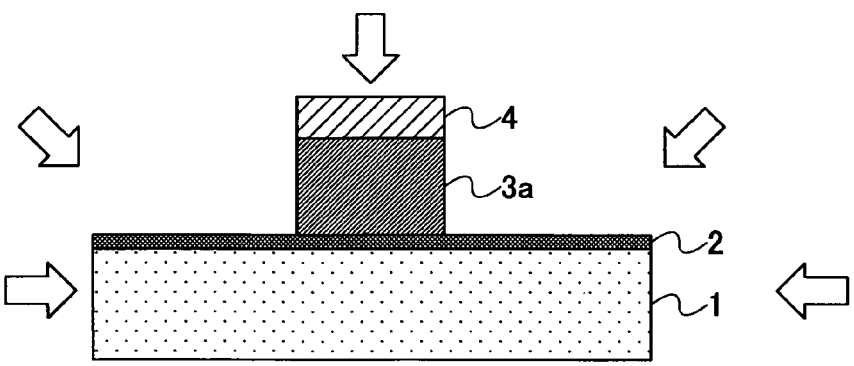

Next, in the step of FIG. 3D, a halogen gas such as a $CCl_4$ gas containing Cl is introduced to the vicinity of the substrate 1 and the substrate is heated to a temperature of preferably 450-500° C. such as 500° C. for 30 minutes. Thereby, there is caused a reaction that converts the metal oxide formed on the substrate 1 to a metal chloride such as the reaction converting $HfO_2$ to $HfCl_4$. It is known that, when $HfO_2$ is thus heated to the temperature of 450-500° C. in the ambient of $CCl_4$, there occurs formation of $HfCl_4$. Reference should be made to Takagi, Susumu, "Kagoubutsu no Jiten".

Further, such a change occurs generally selectively in the part where the insulation film 2 is not covered with the gate electrode 3a and where the high-K dielectric film such as the $HfO_2$ film is exposed to the halogen gas, including the rear surface and bevel.

In such a case, it is preferable to protect the gate electrode 3a by increasing the thickness of the mask film 4 or providing a silicon nitride film (SiN film) between the hard mask film 4 and the gate electrode 3a, for preventing modification of the gate electrode 3a by the halogen gas.

Figure 3E:
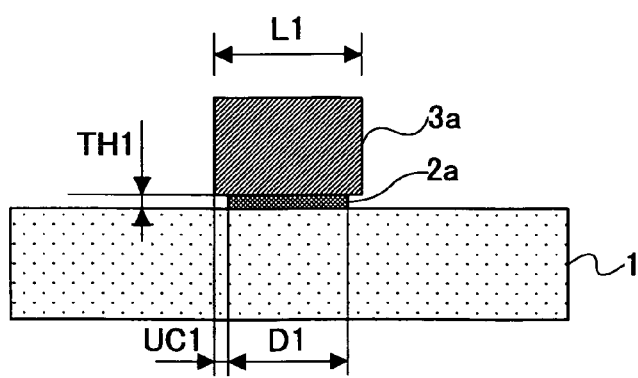

Next, in the step of FIG. 3E, the substrate 1 is heated to a temperature of 320° C. under a reduced pressure environment, wherein there is caused sublimation of the metal chloride such as $HfCl_4$ formed in the step of FIG. 3D, and the insulation film 2 is removed generally selectively from the part not covered with the gate electrode 3a, resulting in formation of the gate insulation film 2a. While it is known that $HfCl_4$ causes sublimation at the temperature of 315° C. or higher, this sublimation temperature is lowered under the reduced pressure environment, and thus, it is preferable to conduct the sublimating processing of $HfCl_4$ under such reduced pressure environment.

Alternatively, it is possible, in view of the fact that $HfCl_4$ undergoes hydrolysis, to form the gate insulation film 2a by removing the $HfCl_4$ film by processing the substrate 1 by water or a solution containing water.

Next, after removal of the $HfCl_4$ film, residues on the substrate 1 are removed by processing with DHF (diluted hydrofluoric acid), and formation of the gate electrode is completed. It should be noted that there exists a native oxide film on the substrate 1 and there can be a case that a reaction layer of Hf and Si is formed in such a native oxide film, while it became possible to reduce the concentration of the residues to the level of $10^{-10}$ atoms/cm$^2$ by etching the substrate 1 to a depth corresponding to about 10 nm in terms of the thickness of $SiO_2$ film.

Further, it is also possible to conduct the reaction of FIG. 3D that converts the metal oxide to metal halogen compound, by supplying radicals or ions of halogen such as Cl radicals to the part in the vicinity of the substrate in place of supplying the halogen gas. In this case, the radicals may be formed by plasma. For example, there are methods of forming Cl radicals that induce dissociation in the halogen gas by using parallel plate plasma, ECR plasma, or ICP. Alternatively, the radicals may be formed by photoexcitation or using catalyst.

It should be noted that a similar effect as in the case of FIG. 3D, in which thermal annealing process is conducted in the halogen gas ambient, is obtained also in such a case of using the radicals of halogen.

When forming the gate insulation film 2a with the present embodiment, the part of the insulation film 2 not covered with the gate electrode 3a is selectively removed. However, because of diffusion of halogen, there occurs a slight etching in the part of the gate insulation film 2a covered by the gate electrode 3a in correspondence to the part near the edge of the gate electrode 3a because of formation of metal halide such as $HfCl_4$ in such an edge part.

Thus, the length D1 of the gate insulation film 2a parallel to a gate length L1 of the gate electrode 3a becomes slightly smaller than the gate length L1 of the gate electrode 3a. In other words, there is formed an undercut UC1 in such a gate insulation film 2a at the respective edge parts.

In such a case, the undercut UC1, extending from the edge of the gate electrode 3a contacting the gate insulation film 2a to the edge of the gate insulation film 2a, has a length generally identical with the thickness TH1 of the gate insulation film 2a.

It should be noted that it is difficult to obtain the insulation film 2a having such excellent pattern shape when the etching of the insulation film 2 has been conducted by other process.

Figure 4:
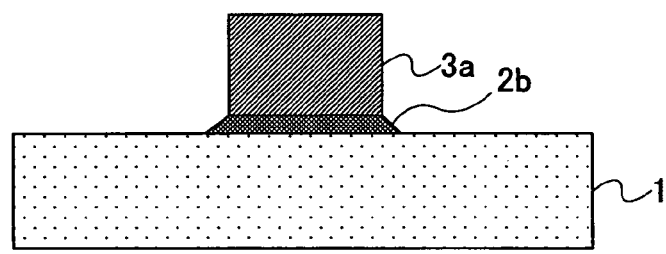
FIG. 4 is a diagram showing an example of a semiconductor device formed by a method different from those of FIGS. 3A-3E.

For example, in the approach of converting the insulation film 2 to amorphous phase by ion irradiation before conducting the etching process of the insulation film 2, there arises a problem in that the gate insulation film 2 remains at the edge part of the gate electrode 3a as shown in FIG. 4 in view of the fact that the ion irradiation tends to become insufficient at such edge part of the gate electrode 3a.

Further, when attempt is made to remove the crystallized insulation film 2 by an RIE process while using plasma of a chlorine family gas, there is caused a problem in that the Si substrate undergoes severe etching as compared with the insulation film 2 of a metal oxide in view of smaller etching resistance of the Si substrate.

With the present embodiment, it becomes possible to form a highly miniaturized semiconductor device operating at high speed by forming a high-K dielectric film of excellent pattern shape by controlling the undercut UC to be generally equal to the thickness TH of the gate insulation film 2a and by using such a high-K dielectric film for the gate insulation film.

Further, by using the present embodiment, it becomes possible to remove the high-K dielectric film such as the $HfO_2$ film from the bevel part of the substrate 1 formed along the peripheral edge of the substrate as well as from the rear side of the substrate 1 opposite to the side on which the semiconductor device is formed.

Figure 5:
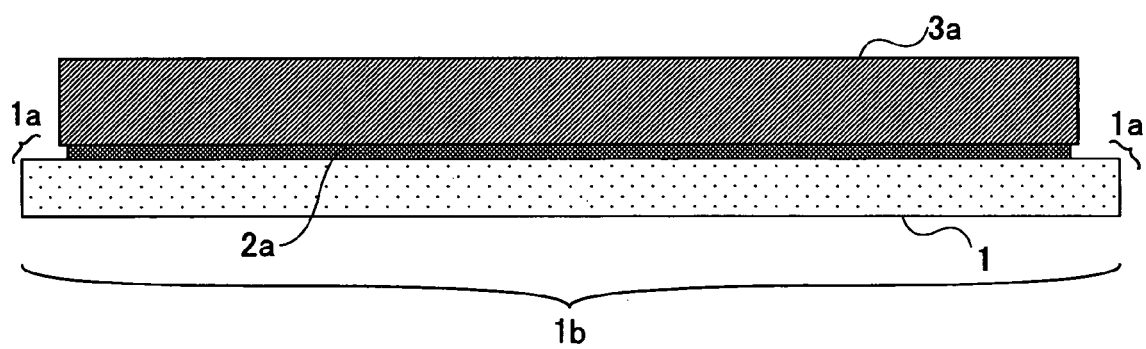
FIG. 5 is a diagram showing the substrate formed with the semiconductor device according to the method of FIGS. 3A-3E.

FIG. 5 shows the overall construction of the substrate 1 obtained in the step of FIG. 3E in a cross-sectional view, wherein those parts corresponding to the parts described previously are designated by the same reference numerals.

Referring to FIG. 5, it can be seen that the substrate 1 is formed with the gate insulation film 2a and the gate electrode 3a formed on the gate insulation film 2a as a result of the process shown in FIGS. 3A-3D. In the actual structure, the gate electrode 3a and the gate insulation film 2a are patterned while FIG. 5 is represented by omitting such patterning.

As noted previously, the insulation film 2 is deposited in the step of FIG. 3A also on the bevel part 1a and the rear side 1b of the substrate 1, while the present invention can remove the insulation film 2 form such regions by the steps of FIGS. 3D-3E.

When doing this, it is necessary to remove the gate insulation electrode 3 such as the polysilicon film deposited on the bevel part 1a or the rear side of the substrate 1 in the step of FIG. 3B so as to cover the insulation film 2, while such removal of the gate electrode film 3 is advantageously conducted by a wet etching process of the substrate conducted in an etchant of a fluoro-nitric acid ($HF/HNO_3$).

In the case the insulation film 2 is removed in the step of FIG. 3D by other process such as an etching process applied after converting the insulation film 2 to amorphous phase by way of ion irradiation, the ions have the strong tendency of traveling straight, and it is difficult to irradiate ions to the bevel part 1a or the rear side 1b of the substrate. Thus, it is difficult to remove the insulation film deposited on the bevel part 1a of the rear side 1b of the substrate 1 with such a process.

It should be noted that the insulation film 2 thus deposited on the bevel part 1a or the rear side 1b of the substrate 1 can become an impurity in the fabrication process of semiconductor device, and thus, such unnecessary insulation film 2 has to be removed.

Because the present embodiment uses halogen gas or radicals of halogen gas formed by dissociating the halogen gas, the halogen gas or the halogen gas radicals can reach the bevel part 1a or the rear side of the substrate 1 easily and there is caused a reaction also in these parts that converts the metal oxide to the metal halogen compound.

Thus, with the present embodiment, it becomes possible to remove the highly crystallized high-K dielectric film, which has been difficult to be removed from the bevel part or rear side of the substrate, while this enables the use of the high-K dielectric film for the gate insulation film and it becomes possible to fabricate a highly miniaturized high-speed semiconductor device operating at high speed.

Further, while the present embodiment has been explained for the case of using $HfO_2$ for the gate insulation film, a similar effect is achieved also when other metal oxide such as $ZrO_2$ is used for the gate insulation film. Further, the metal oxide film such as the $HfO_2$ film or the $ZrO_2$ film may contain nitrogen therein. By incorporating nitrogen into the high-K gate insulation film, the performance of the gate insulation film as a barrier is improved, and the problem of the impurity element in the gate electrode causing diffusion into the channel region of the semiconductor device is effectively blocked.

Further, while the present embodiment has been described as using a gas containing chlorine such as $CCl_4$ as the halogen used for converting the metal oxide to halide, the present invention is not limited to such a specific embodiment and similar effect can be achieved also by using other gas containing chlorine or a chlorine gas, or by using other halogen gas containing F, Br, or the like.

Second Embodiment

Next, the fabrication process of a semiconductor device that includes therein a CMOS structure and includes the process of the first embodiment will be described with reference to FIGS. 6A-6K.

Figure 6A:
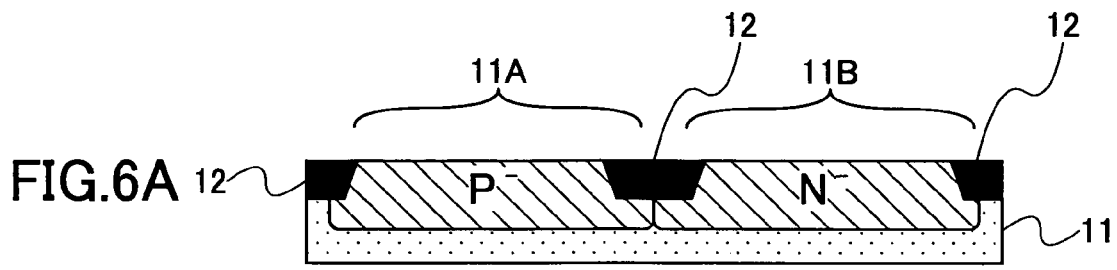

First, in the step of FIG. 6A, a device region 11A and a device region 11B are formed on a Si substrate 11 by a device isolation structure 12 formed by an STI process or a LOCOS process, wherein the device region 11A is formed as a p-type region of low impurity concentration level while the device region 11B is formed as an n-type region of low impurity concentration level.

Figure 6B:
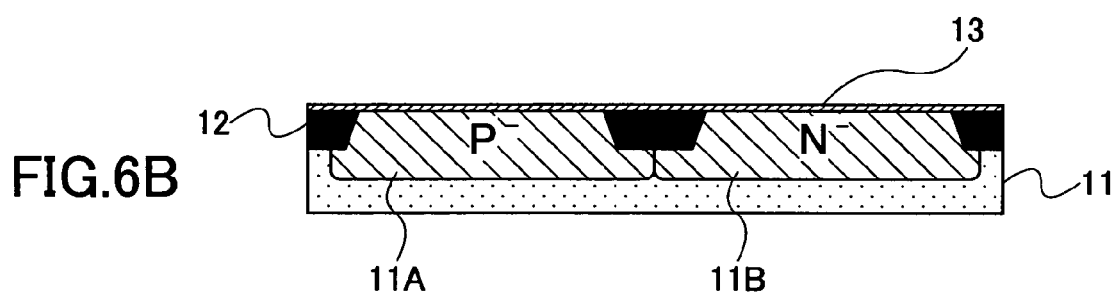

Next, in the step of FIG. 6B, there is formed an insulation film 13 of a metal oxide high-K dielectric such as $HfO_2$ on the device region 11A and the device region 11B by an ALD process or MOCVD process with a thickness of 3 nm.

Figure 6C:
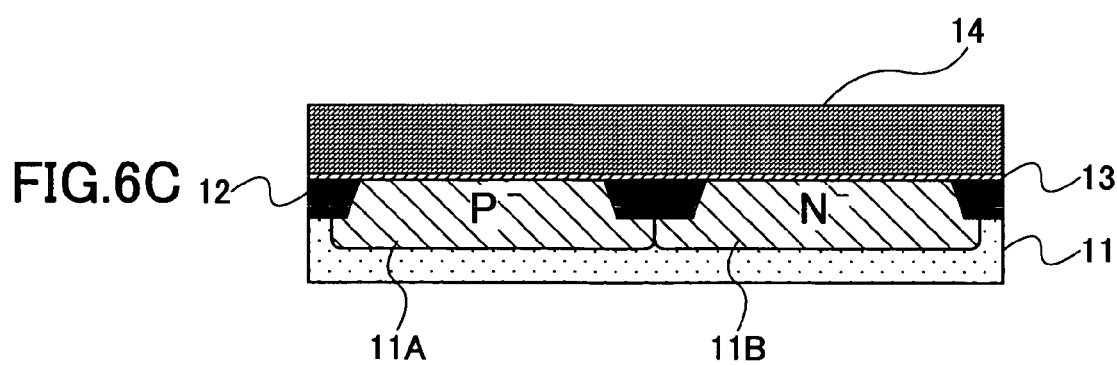

Next, in the step of FIG. 6C, there is formed a gate electrode film 14 of polysilicon on the insulation film 13 by an LPCVD (low-pressure CVD) process with a thickness of 110 nm.

Next, in the step of FIG. 6D, a hard mask film 15 used as hard mask when patterning the gate electrode film 14 is deposited on the gate electrode film 14 by a CVD process with a thickness of 50 nm, for example, in the form of silicon oxide film or silicon nitride film.

Next, in the step of FIG. 6E, a resist film is formed on the hard mask film 15, wherein the resist film thus formed is patterned by a photolithographic process to form a resist pattern for formation of the gate electrode, and the patterning of the hard mask film 15 is conducted by a CF family gas while using the resist mask pattern as a mask. Further, while using the hard mask film 15 thus patterned as a hard mask, the gate electrode 14 is patterned by an RIE process while using a gas of a Br compound. With this, there is formed a gate electrode 14a.

After the patterning process conducted by the RIE process, a wet etching process is conducted, followed by an ashing process, and after the ashing process, a wet etching process is conducted further for removing the deposits formed during the etching process or any residues.

Next, in the step of FIG. 6F, the hard mask film 15 is removed, and the polysilicon gate electrode film 14, deposited in the step of FIG. 6C and covering the bevel part or rear side of the substrate 11 and further the edge part of the substrate, is removed selectively by the fluoric-nitric acid ($HF/HNO_3$).

Next, the substrate 11 is transported to a processing vessel capable of being evacuated, and a thermal annealing process is applied in the ambient of $CCl_4$ under reduced pressure at the temperature of 500° C. for 30 minutes. With this, the exposed part of the insulation film 13, in other words, the part of the insulation film 13 not covered with the gate electrode 14a, is selectively subjected to the reaction that forms a metal halide such as $HfCl_4$ from the metal oxide such as $HfO_2$. Thereby, it should be noted that the same reaction of forming $HfCl_4$ from $HfO_2$ can be caused also when the radicals of halogen are used as explained with reference to FIG. 3D.

Next, the $HfCl_4$ compound layer thus formed is removed by sublimation by heating the substrate 11 to a temperature of 320° C., for example under reduced pressure environment. With this, a gate insulation film 13a is formed.

Further, because $HfCl_4$ causes hydrolysis, it is possible to form the gate insulation film 13a by removing the $HfCl_4$ layer by way of processing the substrate 11 by water or liquid containing water.

As already explained with reference to FIG. 3E, a part of the insulation film 13 not covered with the gate electrode 14a is removed generally selectively at the time of forming the gate insulation film 13a, wherein the part of the $HfO_2$ film 13 located at the edge part of the gate electrode 14a is converted to $HfCl_4$ as a result of diffusion of the halide. Thus, the gate insulation film 13a has a length D2 in the direction parallel to the gate length L2 such that the length D2 becomes slightly smaller than the gate length L2 of the gate electrode 14a.

Further, it becomes possible to remove the insulation film 13 deposited on the bevel part or rear side or edge part of the substrate 11 with the present embodiment as shown in FIG. 5. Thereby, it becomes possible, with the post processing of the present fabrication step, to fabricate a reliable semiconductor device free from contamination of the semiconductor circuit.

Further, it is possible to conduct the step of removing the $HfO_2$ film from the rear side or bevel part or edge part of the substrate 11, by conducting the process similar to that of FIG. 6F as a separated step before the step of removing the $HfO_2$ film from the device regions 11A and 11B, such as in any step conducted after the step of FIG. 6B. Thereby, as a result of removal of the insulation film 13 deposited on the bevel part or rear side or the edge part of the substrate 11, it becomes possible to fabricate a highly reliable semiconductor device free from the contamination of the semiconductor circuit.

Figure 6G:
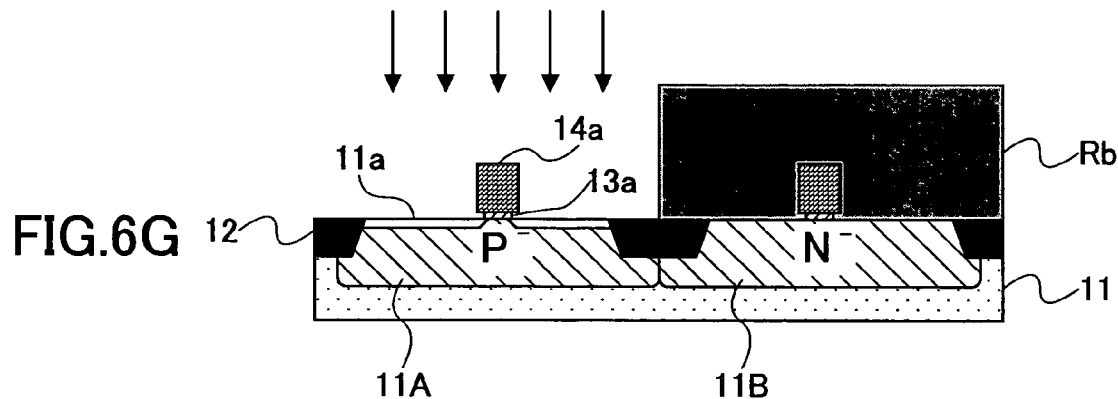

Next, in the step of FIG. 6G, the device region 11B is covered by a resist mask Rb, and a low-concentration diffusion region 11a is formed in the device region 11A by introducing an n-type impurity element thereto.

Figure 6H:
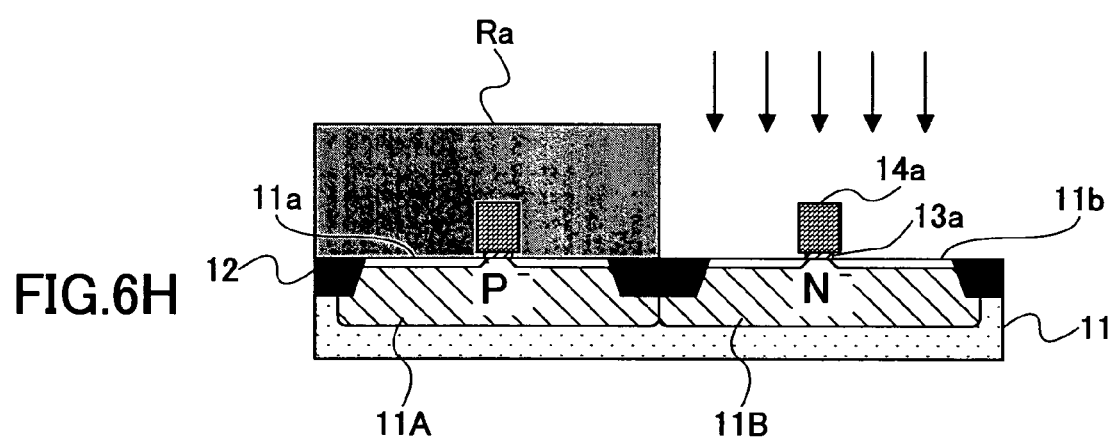

Next, in the step of FIG. 6H, the device region 11A is covered by a resist mask Ra, and a low-concentration diffusion region 11b is formed in the device region 11B by introducing a p-type impurity element thereto.

Figure 6I:
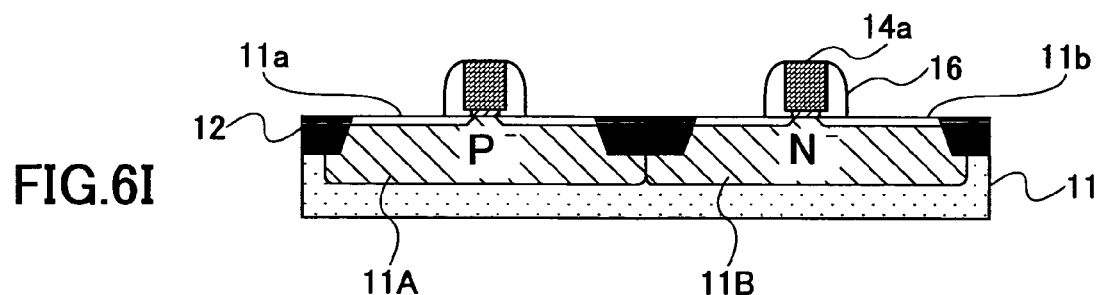

Next, in the step of FIG. 6I, an insulation film of a silicon oxide is formed by a CVD process so as to cover the device regions 11A, 11B and the gate electrode 14a, followed by an etching process to form sidewall insulation films 16.

Figure 6J:
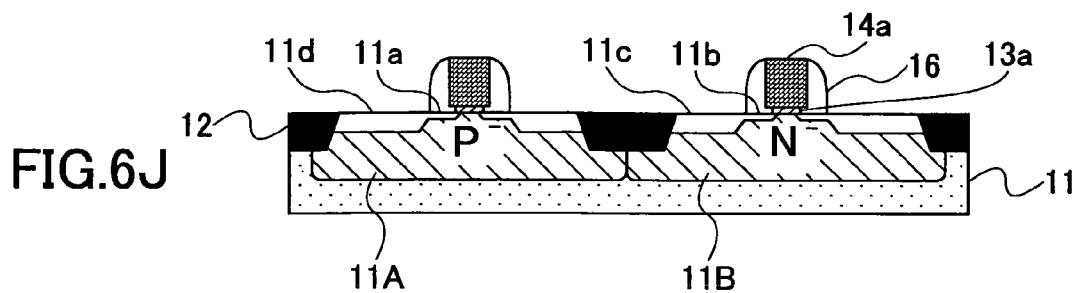

Next, in the step of FIG. 6J, impurity elements of n-type and p-type are introduced respectively into the device regions 11A and 11B similarly to the step of FIGS. 6G-6H, and as a result, there are formed high-concentration diffusion regions 11d in the device region 11A at respective sides of the gate electrode 14a so as to extend from the respective sidewall insulation films 16 to the opposing device isolation structures 12. Similarly, there are formed high-concentration diffusion regions 11c in the device region 11B at respective sides of the gate electrode 14a so as to extend from the respective side wall insulation films 16 to the opposing device regions 12.

Figure 6K:
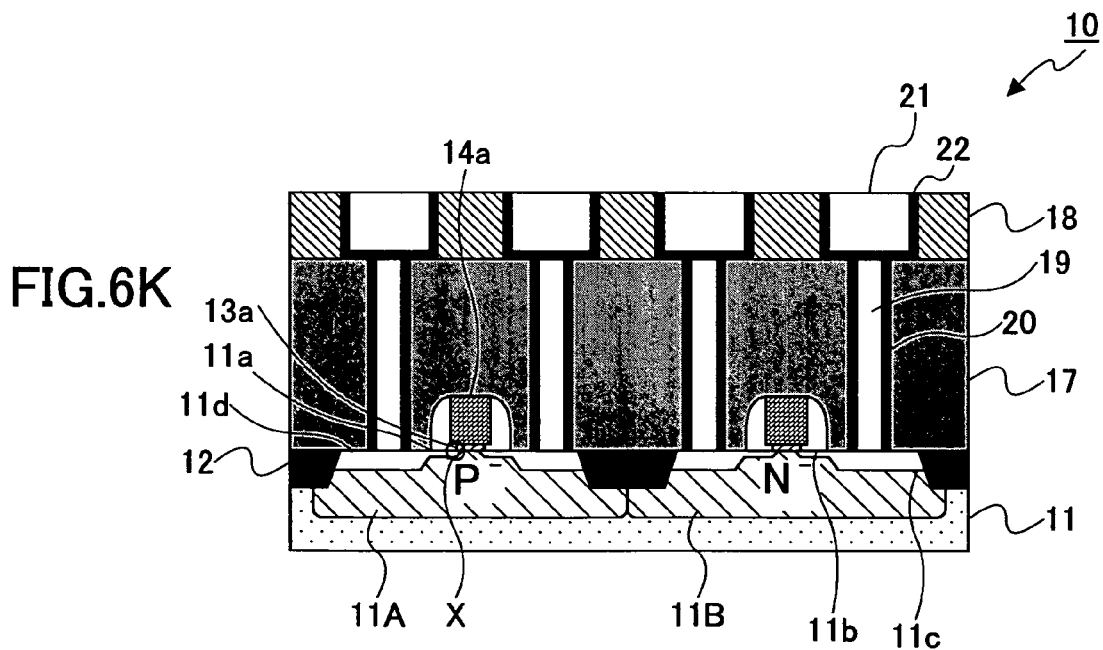

Next, in the step of FIG. 6K, there is deposited an insulation film 17 of PSG (phosphosilicate glass), for example, so as to cover the device regions 11A and 11B and the gate electrode 14a by a CVD process, and contact plugs 19 of W, or the like, are formed in the insulation film 17 in electrical contact with the diffusion regions 11c and 11d in the form that each contact plug 19 is covered by a barrier metal film 20.

Next, a wiring layer is formed in electrical contact with the contact plugs 19.

More specifically, an interlayer insulation film 18 of silicon oxide, fluorine-doped silicon oxide, an organic dielectric, porous dielectric, or the like, is formed so as to cover the insulation film 17. Further, a wiring layer 21 of Cu or Al is formed in the interlayer insulation film 18 in electrical contact with the contact plugs 19 in the form covered by a barrier metal film 22.

Further, a multilayer interconnection structure is formed on the interlayer insulation film 18 thus formed by repeating similar process, and with this, fabrication of the semiconductor device 10 is completed.

Figure 7:
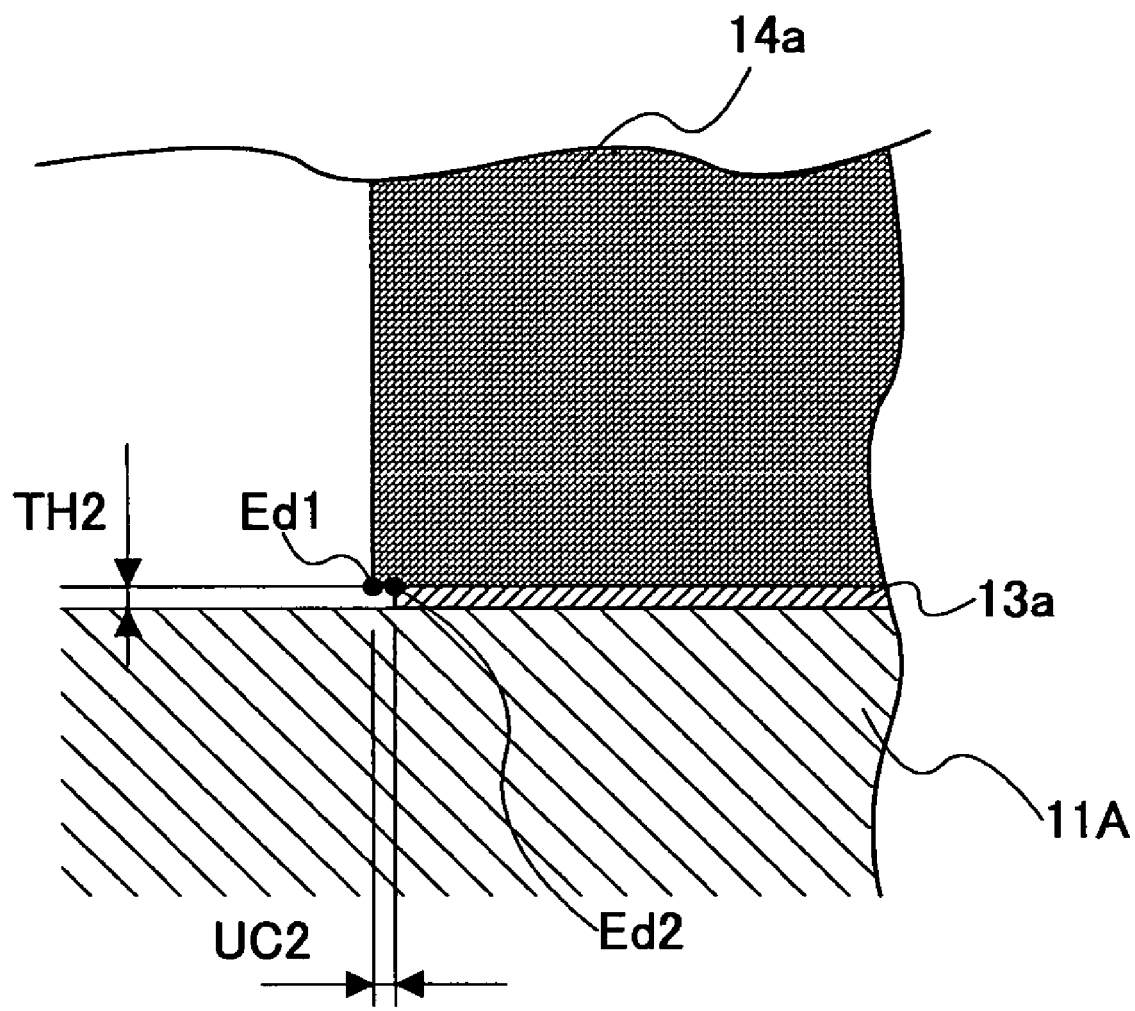
FIG. 7 is a partially enlarged diagram showing the semiconductor device fabricated according to the process of FIGS. 6A-6K.

FIG. 7 shows a part of the gate insulation film 13a represented in FIG. 6K by "X" with enlarged scale, wherein those parts of FIG. 7 explained previously are designated by the same reference numerals and the description thereof will be omitted.

Referring to FIG. 7, it should be noted that there is formed an undercut in the gate insulation film 13a with a recession UC2 defined equal to the distance from a side edge Ed1 of the gate electrode 14a to a lateral edge of the receded gate insulation film 13a, wherein the recession UC2 is generally equal to a thickness TH2 of the gate insulation film 13a.

It should be noted that it is difficult to obtain the insulation film 13a having such excellent shape when the etching of the insulation film 13 has been conducted by other process.

For example, in the approach of converting the insulation film 13 to amorphous phase by ion irradiation before conducting the etching process of the insulation film 13, there arises a problem in that the gate insulation film 13 remains at the edge part of the gate electrode 14a in view of the fact that the ion irradiation tends to become insufficient at such edge part of the gate electrode 14a.

Further, when attempt is made to remove the crystallized insulation film 2 by an RIE process while using plasma of a chlorine or bromine family gas, there is caused a problem in that the Si substrate undergoes severe etching as compared with the insulation film 13 of metal oxide in view of smaller etching resistance of the Si substrate.

With the present embodiment, it becomes possible to form a highly miniaturized semiconductor device operating at high speed by forming a high-K dielectric film of excellent pattern shape by controlling the undercut UC2 to be generally equal to the thickness TH2 of the gate insulation film 13a and by using such a high-K dielectric film for the gate insulation film.

Third Embodiment

Figure 8A:
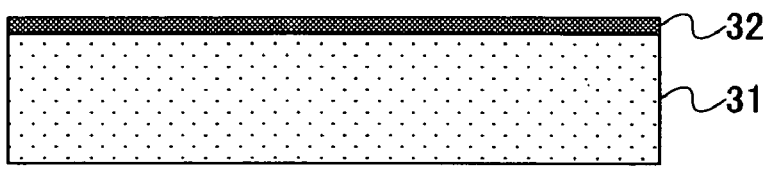
FIGS. 8A-8D are diagrams showing a further fabrication process of a semiconductor device that uses a gate insulation film of a high-K dielectric material.
Figure 8B:
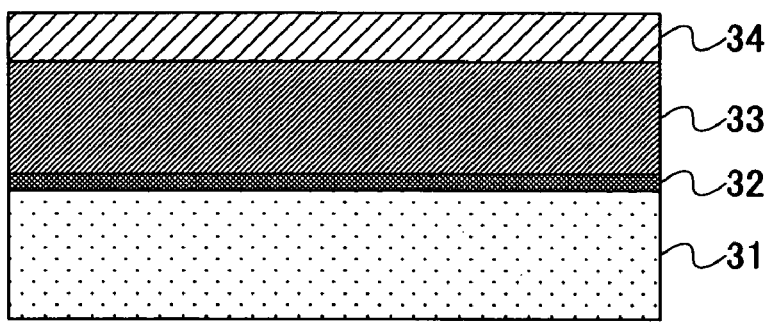
Figure 8C:
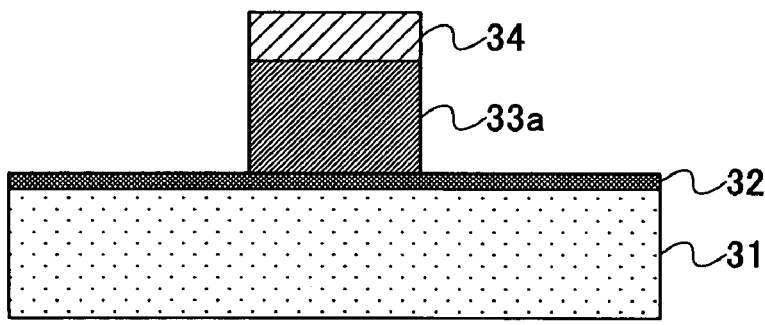

FIGS. 8A-8C are diagrams showing the fabrication process of a semiconductor device according to another related art of the present invention that uses another high-K dielectric form the gate insulation film.

First, a surface of a substrate 31 of Si, for example, is treated in a step of FIG. 8A by a preprocessing process, and an insulation film 32 of a high-K dielectric material such as hafnium aluminate, which is an oxide of Hf containing Al or a compound containing Hf, Al and O, is formed on a device region defined by a device isolation structure not illustrated.

Next, in the step of FIG. 8B, a gate electrode film 33 of polysilicon, or the like, is formed on the insulation film 32, wherein the polysilicon film is formed at a temperature of about 600° C. Further, a silicon oxide ($SiO_2$) film 34 is formed as a hard mask film for patterning the polysilicon film by an etching process.

Next, in the step of FIG. 8C, the gate electrode 33 is subjected to an etching process, wherein the etching process is conducted such that etching of the hard mask film 34 is conducted at first while using a resist pattern formed on the hard mask film 34 as a mask pattern to form a hard mask pattern, and etching of the gate electrode film 33 is conducted by an RIE (reactive ion etching) process that uses a Br compound gas, for example, while using the patterned hard mask film 34 as a mask pattern. With this, a gate electrode 33a is formed.

Figure 8D:
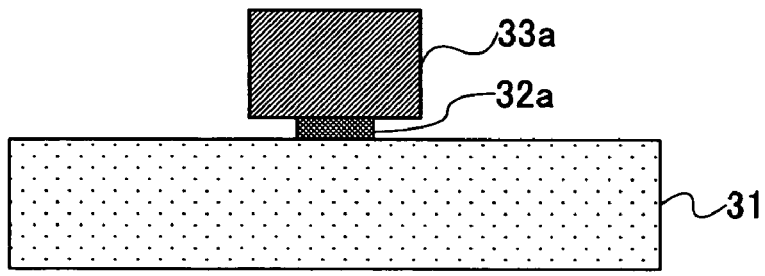

Next, in the step of FIG. 8D, ashing process is conducted, followed by a wet etching process conducted by using a mixture of DHF (diluted hydrofluoric acid), $H_2SO_4$ (sulfuric acid) and $H_2O_2$ (hydrogen peroxide). Thereby, any deposits formed at the time of the patterning process by RIE or any etching residues remaining are eliminated. Such deposits may be formed by re-deposition of the species etched by the RIE process.

However, because of poor etching resistance of hafnium aluminate to such inorganic acids, there is caused a problem with such a chemical treatment in that the hafnium aluminate gate insulation film 32a undergoes extensive etching and there is formed a large undercut underneath the gate electrode 33a as shown in FIG. 8D in the gate length direction.

In order to eliminate such a problem, there is an approach of reducing the etching rate with respect to the etchant by increasing the etching resistivity by way of applying a thermal annealing process to the insulation film 32.

Meanwhile the inventor of the present invention has discovered that the etching rate is tend to be decreased and the etching resistance is tend to be increased with a high-K dielectric film when the high-K dielectric film such as the insulation film of hafnium aluminate is subjected to a thermal annealing process, while it is believed that this is caused as a result of increase of the film density with application of the thermal annealing process, which in turn causes decrease of impurity in the insulation film.

FIGS. 9A-9D are diagrams showing the change of film thickness caused when a wet etching process is applied to a hafnium aluminate film (Hf:Al=80:20) formed with an ALD process, wherein the horizontal axis represents the etching time while the vertical axis represents the thickness of the hafnium aluminate film.

It should be noted that FIGS. 9A-9D show the amount of etching of the hafnium aluminate film formed on an Si substrate respectively for the case of using DHF, $H_2SO_4$ (110° C. in temperature), $H_2SO_4$ (130° in temperature), and SPM (mixture of DHF, $H_2SO_4$ and $H_2O_2$).

Figure 9A:
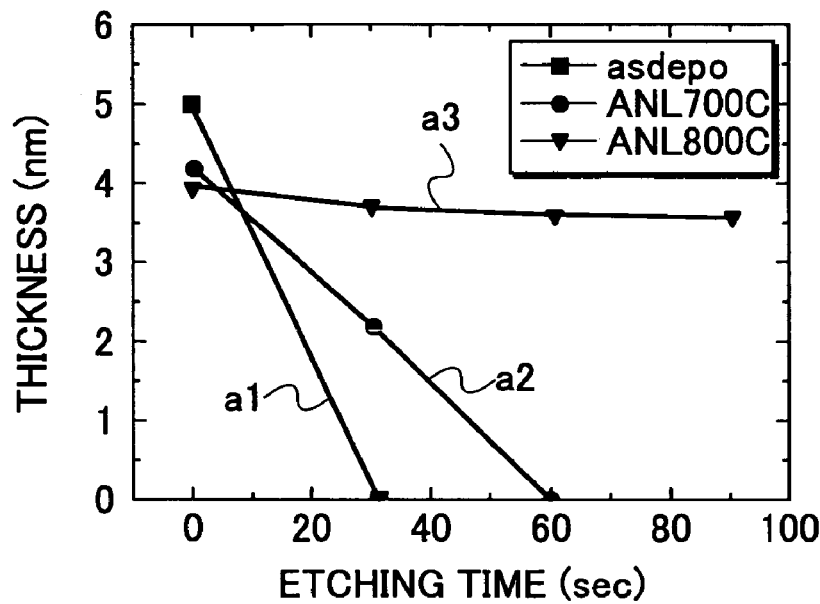
FIGS. 9A-9D are diagrams showing the etching resistance of a high-K dielectric film.

In FIG. 9A, it should be noted that Experiment a1 represents the result of the experiment of etching the hafnium aluminate film without the thermal annealing process, while Experiment a2 shows the result of the experiment in which the hafnium aluminate film has been annealed at 700° C. Further, Experiment a3 shows the result of the experiment in which the hafnium aluminate film has been annealed at 800° C.

Figure 9B:
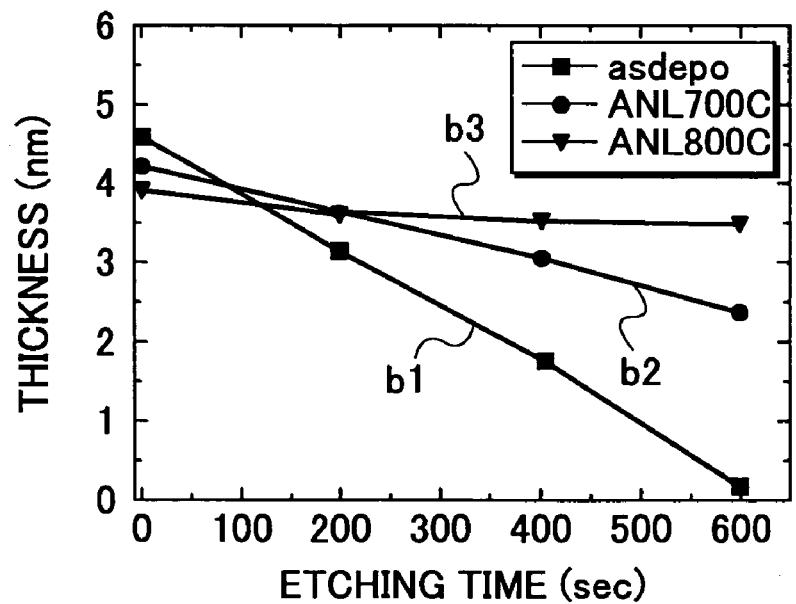
Figure 9C:
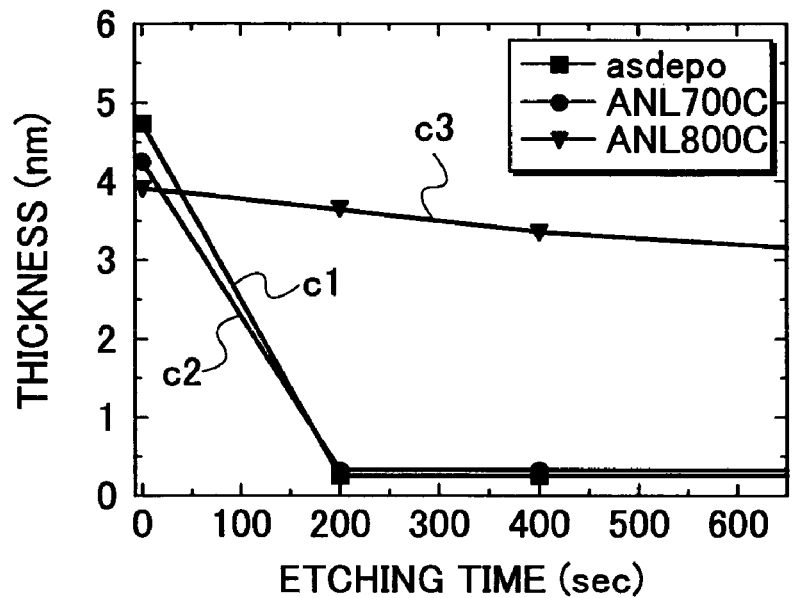
Figure 9D:
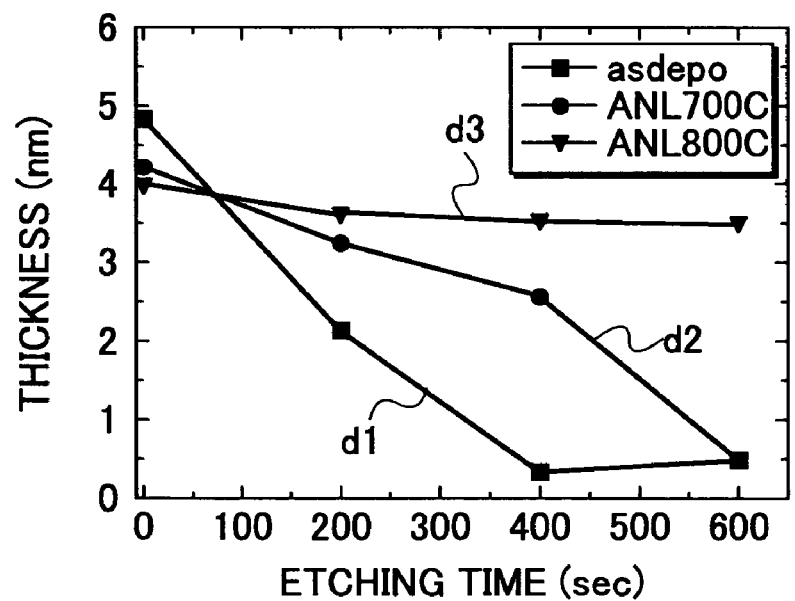
Figure 10A:
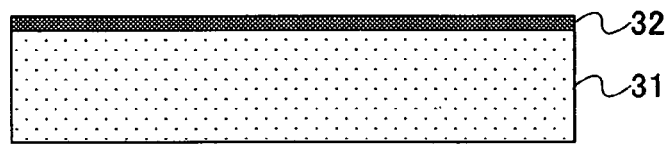
FIGS. 10A-10E are further diagrams showing a further fabrication process of a semiconductor device that uses a gate insulation film of a high-K dielectric material.
Figure 10B:
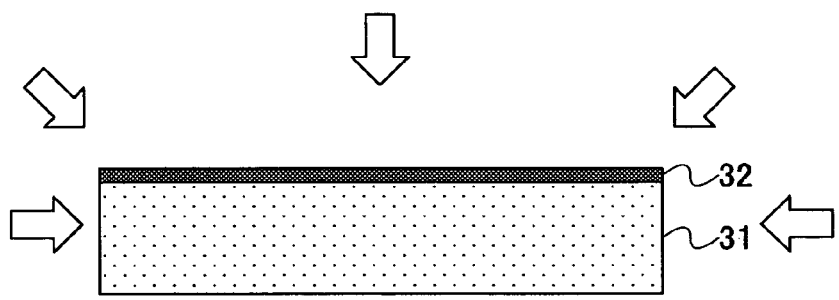
Figure 10C:
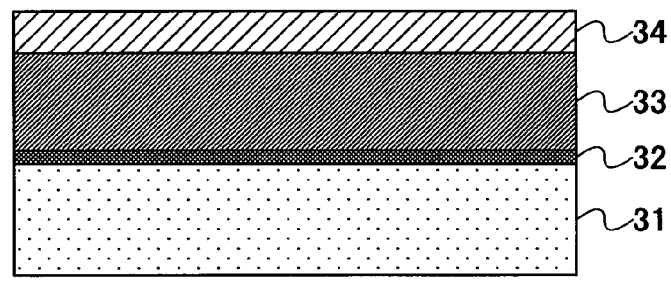
Figure 10D:
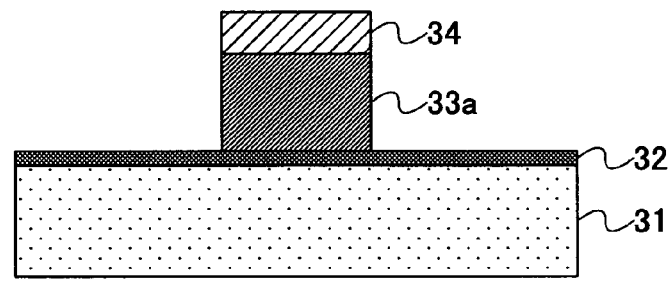

Similarly, the results for the case where no thermal annealing process has been made are represented respectively in FIGS. 9B-9D as Experiments b1, c1 and d1, the results for the case the thermal annealing process has been made at 700° C. are represented respectively in FIGS. 9B-9D as Experiments b2, c2 and d2, and the results for the case the thermal annealing process has been made at 800° C. are represented respectively in FIGS. 10B-10D as Experiments b3, c3 and d3.

Referring to FIGS. 9A-9D, it can be seen that the amount of wet etching is decreased by applying the annealing process to the hafnium aluminate in any of the cases of using different etchants, indicating that the etching resistance of the hafnium aluminate film is improved as a result of the thermal annealing process. Particularly, it can be seen that the resistance against the etching process is increased with the processing temperature, such that the etching resistance increases from the state where no thermal annealing process has been made to the state where the thermal annealing process has been made at 700° C., and from the state where the thermal annealing process has been made at 700° C. to the state where the thermal annealing process has been made at 800° C.

Thus, when a high-K dielectric film such as a hafnium aluminate film is to be used for the gate insulation film of a semiconductor device, it is preferable to use the insulation film with thermal annealing process for improvement of the etching resistance to wet etching process.

For example, in the fabrication process of the semiconductor device shown in FIGS. 8A-8D, it becomes possible to improve the resistance against etchant by annealing the insulation film 32 at a temperature higher than the temperature used for forming the gate electrode film 33, before conducting the wet etching process in FIG. 8D. It should be noted that this thermal annealing process is preferably conducted at the temperature higher than the temperature of forming the polysilicon film such as 700° C. or higher, preferably 800° C. or higher.

Next, the fabrication process of the semiconductor device according to a third embodiment of the present invention that includes such an annealing process will be explained with reference to FIGS. 10A-10D, wherein those parts corresponding to the parts described previously are designated by the same reference numerals and the description thereof will be omitted.

First, in the step of FIG. 10A, the surface of the substrate 31 of Si is applied with the preprocessing, and the high-K dielectric film 32 of hafnium aluminate (Hf:Al=80:20) is formed on the device region defined by the device isolation structure not shown with the thickness of 3 nm by an ALD process or MOCVD process.

Next, in the step of FIG. 10B, the substrate 31 thus formed with the insulation film 32 is annealed in a nitrogen ambient at the temperature of 800° C. for ten minutes by a lamp heating process. With this, the resistance of the insulation film 32 against etching is improved. Further, in the present embodiment, it is possible to nitride the surface of the insulation film 32 before conducting the thermal annealing process.

Next, in the step of FIG. 10C, the gate electrode film 33 of polysilicon is formed on the insulation film 32 with the thickness of 100 nm. In the present embodiment, the polysilicon film 33 is formed at 600° C., and the hard mask film 34 of silicon oxide ($SiO_2$) is formed on the polysilicon film 33 with the thickness of 30 nm. Thereby, it is possible to form a silicon nitride film before forming the gate electrode film 33.

Next, in the step of FIG. 10D, the etching process of the gate electrode film 33 is conducted, wherein the etching process is conduced first with regard to the hard mask film 34 formed on the polysilicon film 33 while using a patterned resist film to form a hard mask pattern, and next with regard to the gate electrode film 33 by using an RIE process that uses an etching gas such as a HBr gas, while using the patterned hard mask film 34 as a mask. With this, the gate electrode 33a is formed.

Further, the resist pattern is removed by an ashing process and any deposits or etching residues formed at the time of the RIE process are removed by conducting a wet etching process by using a mixture of DHF, $H_2SO_4$ and $H_2O_2$.

In this case, the resistance of the hafnium aluminate film against the wet etching process is improved as a result of the thermal annealing process, and there is caused no extensive formation of undercut in the insulation film 32 as in the case of the process of FIG. 8D. Thus, the amount of the etching caused in the insulation film 32 as a result of such a wet etching process is limited with the present embodiment.

Figure 10E:
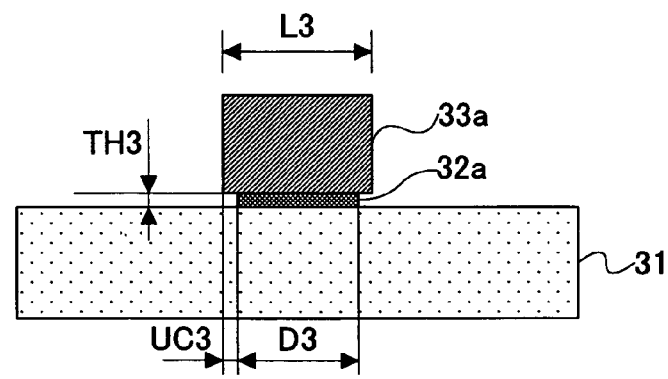

Next, in the step of FIG. 10E, the structure of FIG. 10D is subjected to a treatment in a concentrated hydrofluoric acid at 135° C., followed by dipping in a diluted hydrofluoric acid solution of 2% concentration. Thereby, the part of the insulation film 32 of hafnium aluminate not covered with the gate electrode 33a is etched out generally selectively with regard to the part covered with the gate electrode 33a.

Here, it should be noted that the insulation film 32 of hafnium aluminate has increased resistance to the wet etching process as a result of the thermal annealing process conducted in the step of FIG. 10B, while in the step of FIG. 10E, it is possible to remove the hafnium aluminate entirely by increasing the temperature of the etchant and by conducting the dipping process for a prolonged duration as compared with the step of FIG. 10D.

In the step of FIG. 10E, it should be noted that, because of reduced etching rate of the hafnium aluminate film, there is achieved another advantageous feature in that the controllability of the etching process is increased.

For example, consider the case where the insulation film 32 has a poor resistance against the etchant and there can occur a large etching rate when the insulation film 32 is subjected to the foregoing wet etching process. In such a case, the amount of the undercut underneath the gate electrode 33a tends to become large, or there are left a large amount of etching residues. Further, when there is a change in the film quality or film thickness in the in-plane direction of the substrate 31, there appears a large difference of etching rate in the in-plane direction of the substrate.

With the present embodiment, such problems are successfully resolved by easily controlling the etching process to a desired etching rate and minimizing the difference of etching rate of the gate insulation film in the in-plane direction of the substrate.

Further, according to the present embodiment, the gate insulation film 32a has a length D3 in the direction parallel to the direction of the gate length L3 of the gate electrode 33a, such that the length D3 is slightly smaller than the gate length L3. With regard to this feature of the present embodiment, description will be made with reference to FIG. 14.

Fourth Embodiment

It should be noted that the third embodiment explained with reference to FIGS. 10A-10E can be modified as shown in FIGS. 11A-11E, wherein FIGS. 11A-11E show a fourth embodiment of the present invention. In FIGS. 11A-11E, those parts corresponding to the parts described previously are designated by the same reference numerals and the description thereof will be omitted.

Figure 11A:
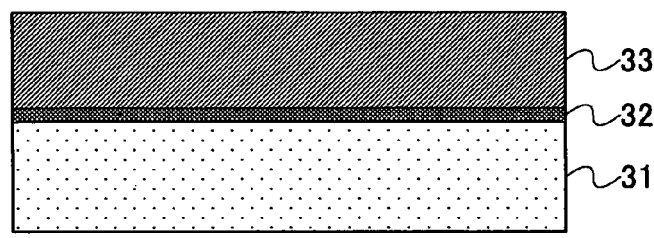
FIGS. 11A-11E are further diagrams showing a further fabrication process of a semiconductor device that uses a gate insulation film of a high-K dielectric material.

First, in the step of FIG. 11A, the surface of the substrate 31 of Si is applied with the preprocessing, and the high-K dielectric film 32 of hafnium aluminate (Hf:Al=80:20) is formed on the device region defined by the device isolation structure not shown with the thickness of 3 nm by an ALD process or MOCVD process.

Further, in the step of FIG. 11A, the gate electrode film 33 of polysilicon is formed on the insulation film 32 with the thickness of 100 nm. In the present embodiment, the polysilicon film 33 is formed at 600° C. Thereby, it is possible to nitride the surface of the insulation film 32 before forming the gate electrode film 33.

Figure 11B:
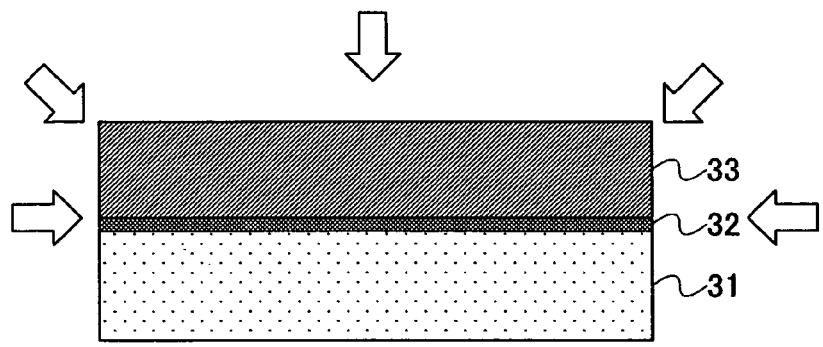
Figure 11C:
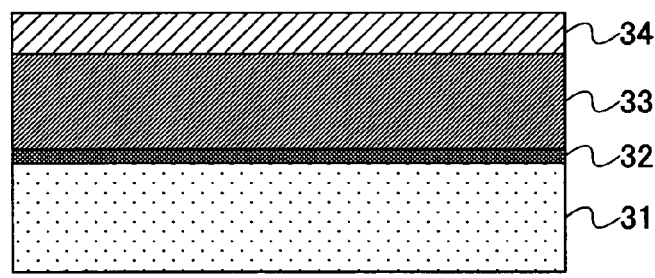

Next, in the step of FIG. 11B, the substrate 31 thus formed with the insulation film 32 is annealed in a nitrogen ambient at the temperature of 800° C. for ten minutes by a lamp heating process. With this, the resistance of the insulation film 32 against etching is improved.

Next, in the step of FIG. 10C, the silicon oxide hard mask film 34 is formed on the gate electrode film 33 as a hard mask for patterning the polysilicon gate electrode film 33 with the thickness of 30 nm. In this case, it is possible to form an antireflection coating on the mask film 34 according to the needs.

Figure 11D:
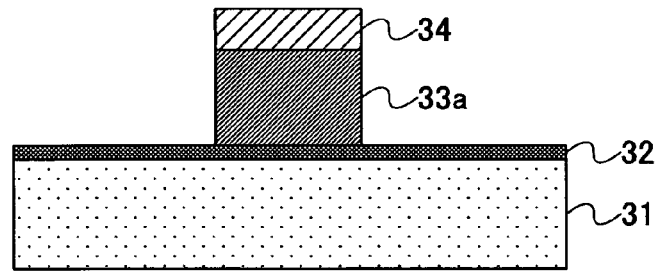
Figure 11E:
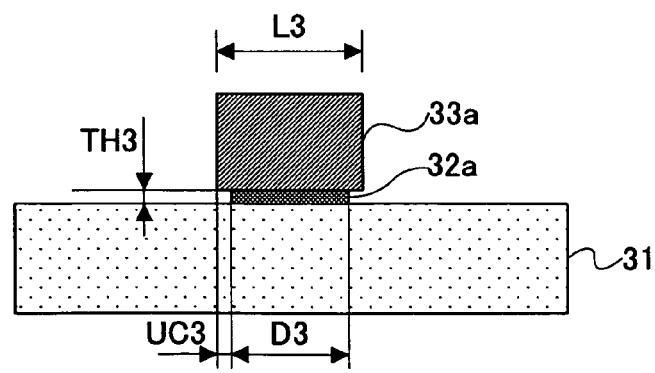

The steps of FIGS. 11D and 11E are identical to those of FIGS. 10D and 10E respectively.

With the present embodiment, the process steps from the formation of the insulation film 32 to the formation of the gate electrode film 33 are conducted continuously, and chance of the surface of the gate insulation film 32 being contaminated is minimized as compared with the case of the previous embodiment.

Usually, different processing apparatuses are used for the formation of the insulation film 32 and for the thermal annealing processing, and thus, there is a possibility that the surface of the insulation film 32 is contaminated when the substrate is transported from one processing apparatus to a next processing apparatus in the state that the surface of the insulation film 32 is exposed. Further, there is a possibility that the surface of the insulation film 32 is contaminated during the thermal annealing processing.

With the present embodiment, the gate electrode film 33 is formed immediately after formation of the insulation film 32, and the surface of the insulation film 32 is protected by the gate electrode film 33. Thereby, the surface of the insulation film 32 is protected from contamination.

Fifth Embodiment

It should be noted that the third embodiment shown in FIGS. 10A-10E can be modified as shown in FIGS. 12A-12E showing a fifth embodiment of the present invention. In FIGS. 12A-12E, those parts corresponding to the parts described previously are designated by the same reference numerals and the description thereof will be omitted.

Figure 12A:
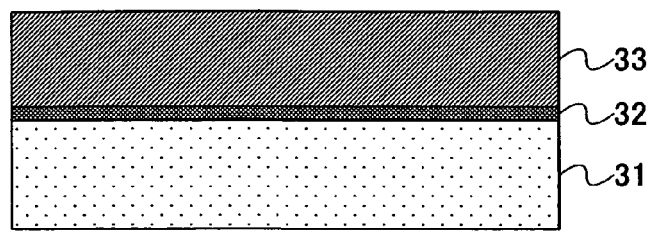
FIGS. 12A-12E are diagrams showing a further fabrication process of a semiconductor device that uses a gate insulation film of a high-K dielectric material.
Figure 12B:
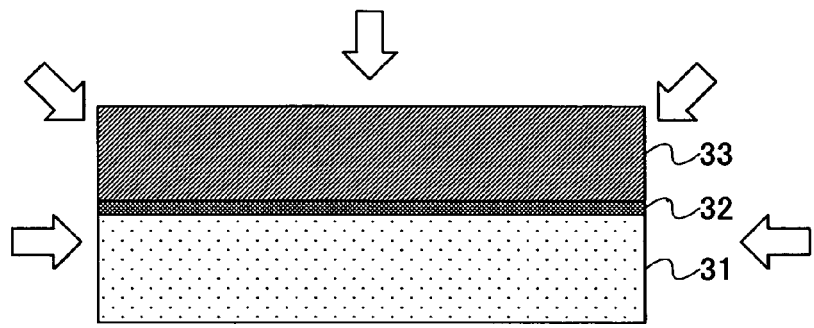
Figure 12C:
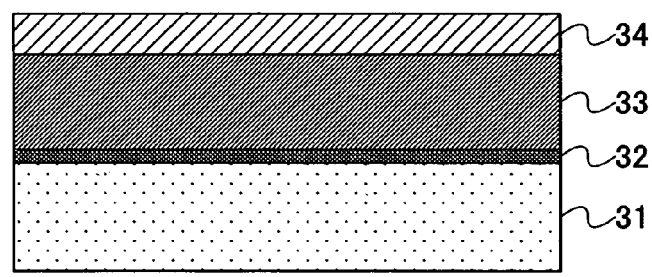

Referring to the drawings, the process from the step of FIG. 12A to the step of FIG. 12C is identical with the process from the step 11A to the step 11C of the previous embodiment.

With the present embodiment, the process similar to the process of FIG. 10D explained before is conducted in the step of FIG. 12D, wherein FIG. 12D further carries out the processing of applying ion impact to the insulation film 32 by way of excitation of plasma such as $N_2$ plasma. It should be noted that the insulation film 32 thus applied with ion impact changes to become less resistant to etching process, and thus, the etching process of the insulation film 32 in the next step of FIG. 12E is facilitated.

Figure 12D:
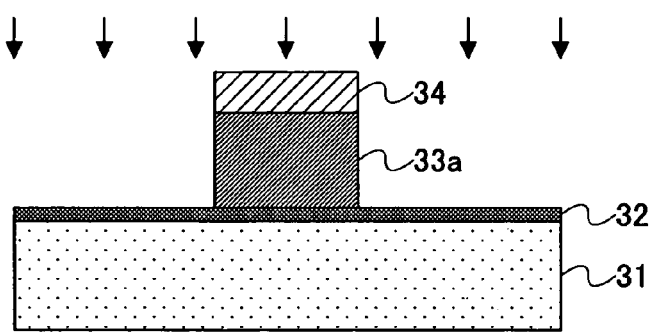
Figure 12E:
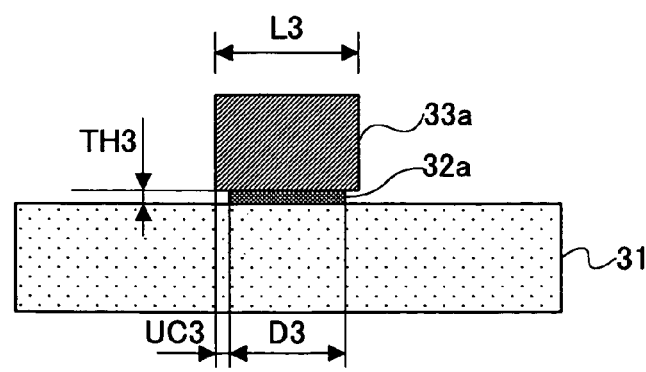

Thus, in the next step of FIG. 12E, the structure of FIG. 12D is treated in a concentrated hydrofluoric acid of 135° C. for 3 minutes, followed by dipping in a diluted hydrofluoric acid solution of the concentration of 2% for 15 seconds. Thereby, it becomes possible to etch away the part of the hafnium aluminate film 32 not covered with the gate electrode 33a generally selectively with regard to the part covered with the gate electrode 33a.

With the present embodiment, the etching resistance of the insulation film 32 is increased with the thermal annealing process, while after the plasma irradiation process in the step of FIG. 12D, the etching resistance is reduced and the insulation film 32 changes to a film that can be etched easily. With the present embodiment, the efficiency of the processing is improved.

With the present embodiment, the time needed for the processing in the concentrated hydrofluoric acid is reduced to about 1/10 of the process of FIG. 10E or FIG. 11E.

While the use of hafnium aluminate (a compound of Hf and Al and O) has been disclosed with regard to the third through fifth embodiments, the present invention is not limited to such a particular material and the gate insulation film of other material can also be used. For example, the effect similar to those of the third through fifth embodiments can be attained also in the case of using hafnium silicate (an oxide of Hf containing Si or a compound of Hf and Si and O) for the gate insulation film 32.

Further, the hafnium aluminate or hafnium silicate may contain nitrogen, and that the gate insulation film may be formed in the form of lamination of the hafnium aluminate film and the hafnium silicate film.

With such a laminated structure, it is also possible that one or both of the hafnium aluminate film and the hafnium silicate film contain nitrogen. With such a construction, too, the effect similar to those explained with reference to the third through fifth embodiments can be attained.

Sixth Embodiment

Next, the method of fabricating a semiconductor device including a CMOS device that uses the method described in the fourth embodiment, will be described step by step with reference to FIGS. 13A-13K.

Figure 13A:
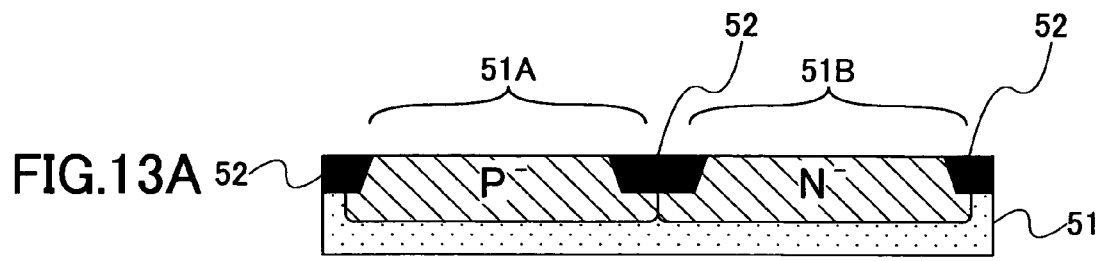
FIGS. 13A-13K are diagrams showing a further fabrication process of a semiconductor device that includes therein a CMOS device using a gate insulation film of a high-K dielectric material.

First, in the step of FIG. 13A, a device region 51A and a device region 51B are formed on a Si 51 by a device isolation structure 52 formed by an STI process or a LOCOS process, wherein the device region 51A is formed as a p-type region of low impurity concentration level while the device region 51B is formed as an n-type region of low impurity concentration level.

Figure 13B:
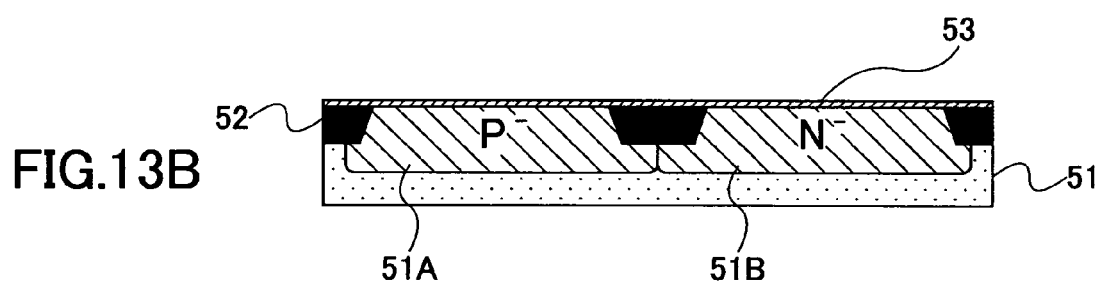

Next, in the step of FIG. 13B, there is formed an insulation film 53 of a metal oxide high-K dielectric such as $HfO_2$ on the device region 51A and the device region 51B by an ALD process or MOCVD process with a thickness of 3 nm.

Figure 13C:
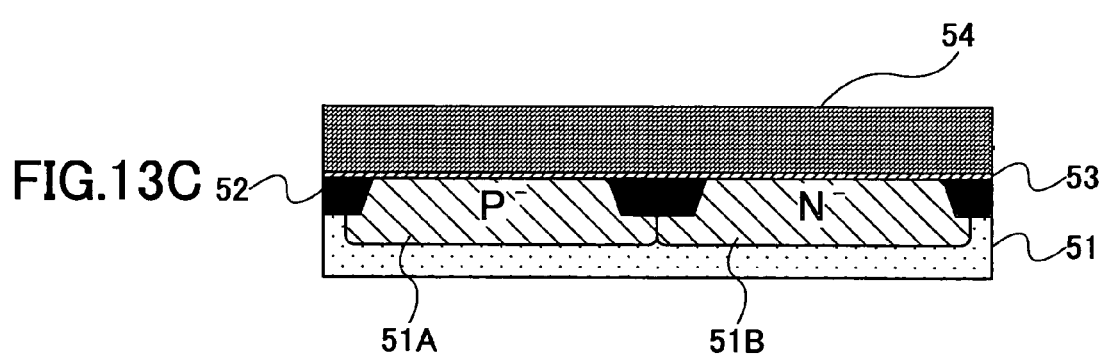
Figure 13D:
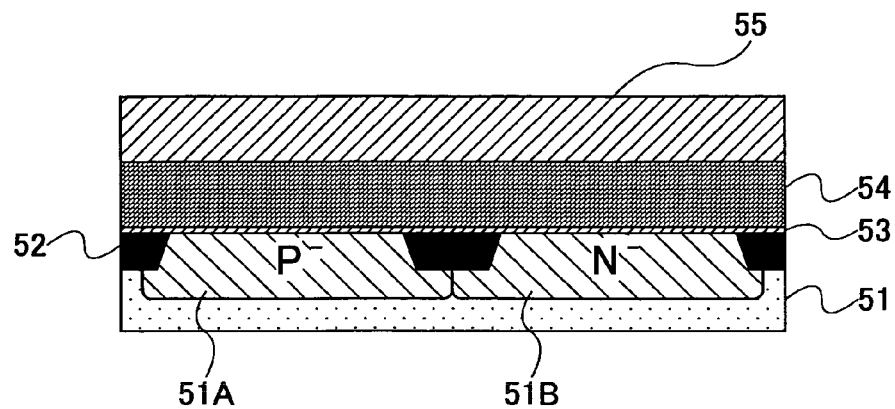

Next, in the step of FIG. 13C, there is formed a gate electrode film 14 of polysilicon, or the like, on the insulation film 13 by an LPCVD (low-pressure CVD) process with a thickness of 100 nm.

Next, the substrate 11 is held for 10 minutes in a nitrogen ambient at the temperature of 800° C. for 10 minutes by conducting a lamp heating process, and thermal annealing process is conducted to the insulation film 53 and converts the insulation film 53 to a film having a resistance against wet etching process. This thermal annealing process may be conducted immediately after the step of FIG. 13B.

Next, in the step of FIG. 6D, a hard mask film 15 used as a hard mask when patterning the gate electrode film 14 is deposited on the gate electrode film 14 by a CVD process with a thickness of 30 nm, for example, in the form of silicon oxide film or silicon nitride film.

Figure 13E:
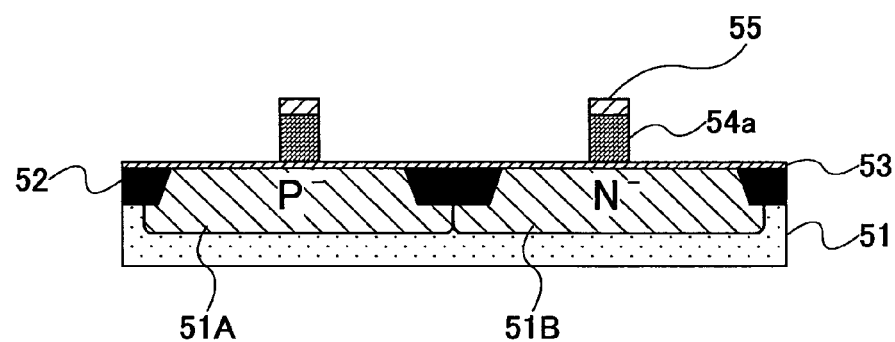

Next, in the step of FIG. 13E, a resist film is formed on the hard mask film 55 wherein the resist film thus formed is patterned by a photolithographic process to form a resist pattern for formation of the gate electrode, and the patterning of the hard mask film 55 is conducted by a CF family gas while using the resist mask pattern as a mask. Further, while using the hard mask film 55 thus patterned as a hard mask, the gate electrode film 54 is patterned by an RIE process that uses a HBr family gas. With this, there is formed a gate electrode 54a.

After the patterning process conducted by the RIE process, an ashing process is conducted for removal of the resist pattern, followed by a wet etching process conducted in a mixture of DHF, $H_2SO_4$ and $H_2O_2$, for removing the deposits formed during the etching process or any etching residues.

Because the wet etching resistance of the hafnium aluminate film is improved as a result of the thermal annealing process, such a wet etching process does not form a deep undercut and the amount of etching caused in the insulation film 53 by such a wet etching process is insignificant.

Figure 13F:
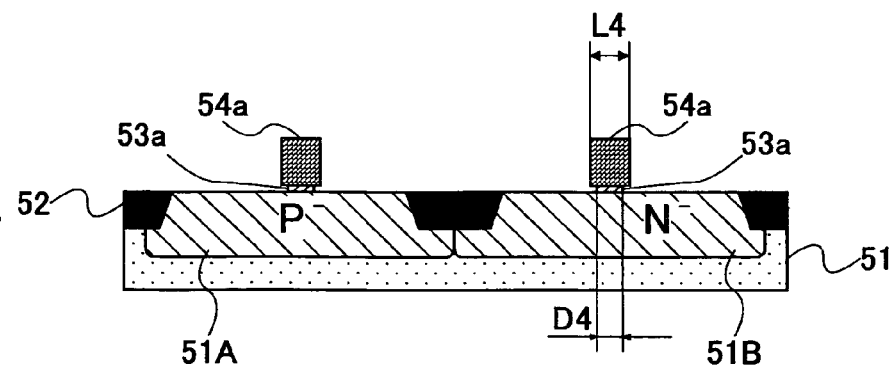

Next, in the step of FIG. 13F, the structure of FIG. 13E is treated by a concentrated hydrofluoric acid of 135° C. for 30 minutes, followed by dipping in a diluted hydrofluoric acid of 2% concentration for 15 seconds. With this, the part of the insulation film 53 of hafnium aluminate not covered with the gate electrode 54a is etched generally selectively with regard to the part covered with the gate electrode 54a. While the hafnium aluminate has increased resistance to the wet etching process as a result of the thermal annealing process, it is nevertheless possible to remove the hafnium aluminate film 53 completely in using a higher etchant temperature and longer dipping time as compared with the step of FIG. 13E.

Thereby, it is also possible to reduce the etching time by conducting the plasma irradiation process explained with reference to FIG. 12D before the step of FIG. 13F, such that the insulation film 53 is applied with ion impact.

With the present embodiment, the length D2 of the gate insulation film 13a measured in the direction parallel to the gate length of the gate electrode 54a becomes slightly smaller than the gate length L2 of the gate electrode 54a.

Figure 13G:
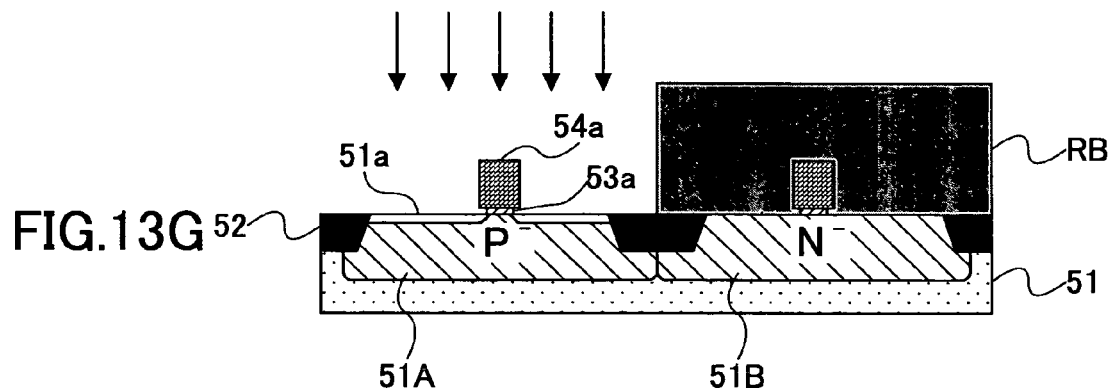

Next, in the step of FIG. 13G, the device region 51B is covered by a resist mask RB, and a low-concentration diffusion region 51a is formed in the device region 51A by introducing an n-type impurity element thereto.

Figure 13H:
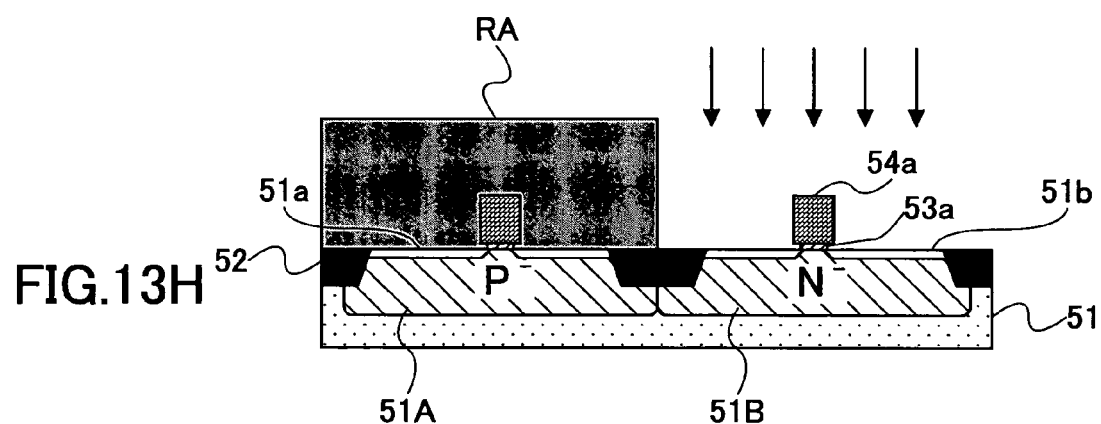

Next, in the step of FIG. 13H, the device region 51A is covered by a resist mask RA, and a low-concentration diffusion region 51b is formed in the device region 51B by introducing a p-type impurity element thereto.

Thus, with the process from the steps from FIGS. 13G to 13H, a chemical liquid is used for removing the resist film, while with the present embodiment, there occurs little etching in the gate insulation film 53a in view of the fact that the etching resistance of the insulation film 53 is improved as a result of thermal annealing process of the insulation film 53.

Further, when to fabricate a CMOS as indicated in the present embodiment, there is a need of conducting ion implantation process of the p-type dopant and n-type dopant separately, while this increases the number of the steps for removing the resist pattern twice. Thus, the present embodiment that uses the gate insulation film resistant against chemical treatment is particularly useful for maintaining the proper shape of the gate insulation film.

Figure 13I:
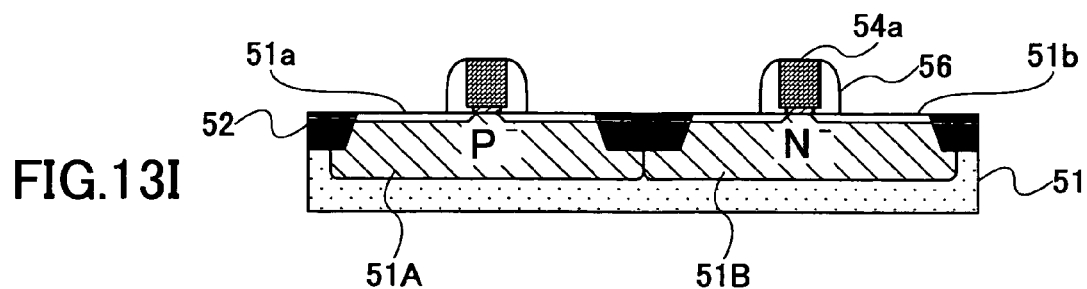

Next, in the step of FIG. 13I, an insulation film of a silicon oxide is formed by a CVD process so as to cover the device regions 51A, 51B and the gate electrode 54a, followed by an etching process to form sidewall insulation films 56.

Figure 13J:
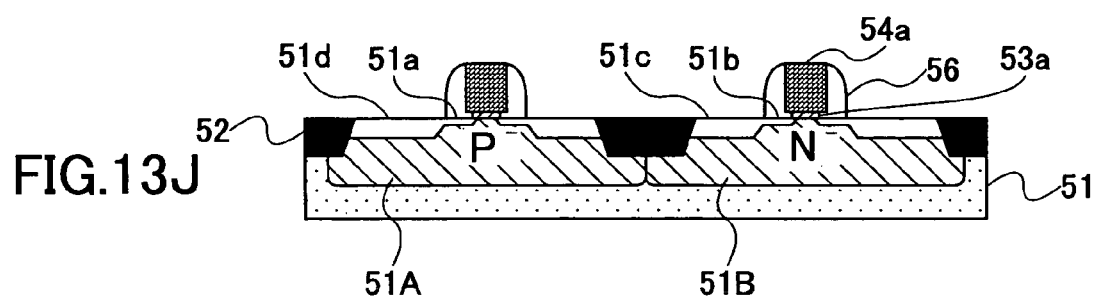

Next, in the step of FIG. 13J, impurity elements of n-type and p-type are introduced respectively into the device regions 51A and 51B similarly to the step of FIGS. 13G-13H, and as a result, there are formed high-concentration diffusion regions 51d in the device region 51A at respective sides of the gate electrode 54a so as to extend from the respective sidewall insulation films 56 to the opposing device isolation structures 52. Similarly, there are formed high-concentration diffusion regions 51c in the device region 51B at respective sides of the gate electrode 54a so as to extend from the respective side wall insulation films 56 to the opposing device regions 52.

With the step 13J, too, there is conducted a step of removing the resist pattern by a chemical treatment in a chemical liquid, while in a CMOS device as in the present case, the number of the steps for removing the resist film becomes twice. Thus, the present embodiment that provides a gate insulation film highly resistant to chemical processing, is particularly useful for fabrication of the semiconductor device with controlled shape for the gate insulation film.

Figure 13K:
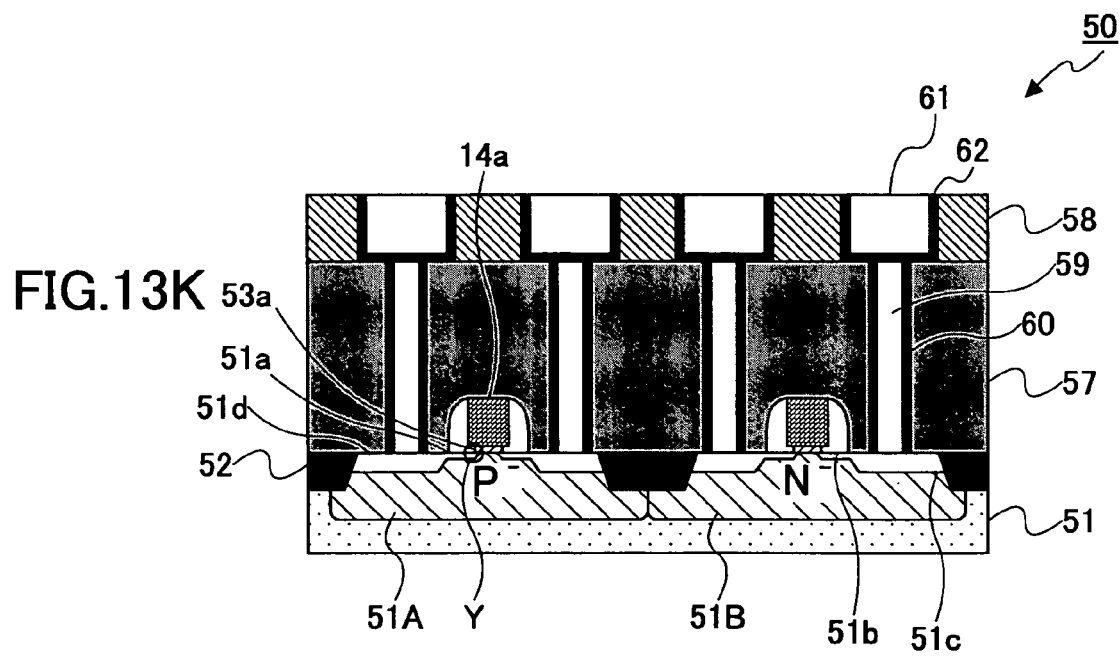

Next, in the step of FIG. 13K, there is deposited an insulation film 57 of PSG (phosphosilicate glass), for example, so as to cover the device regions 51A and 51B and the gate electrode 54a by a CVD process, and contact plugs 59 of W, or the like, are formed in the insulation film 57 in electrical contact with the diffusion regions 51c and 51d in the form that each contact plug 59 is covered by a barrier metal film 60.

Next, a wiring layer is formed in electrical contact with the contact plugs 59.

More specifically, an interlayer insulation film 58 of silicon oxide, fluorine-doped silicon oxide, an organic dielectric, porous dielectric, or the like, is formed so as to cover the insulation film 57. Further, a wiring layer 61 of Cu or Al is formed in the interlayer insulation film 58 in electrical contact with the contact plugs 59 in the form covered by a barrier metal film 62.

Further, a multilayer interconnection structure is formed on the interlayer insulation film 58 thus formed by repeating similar process, and with this, fabrication of the semiconductor device 50 is completed.

Figure 14:
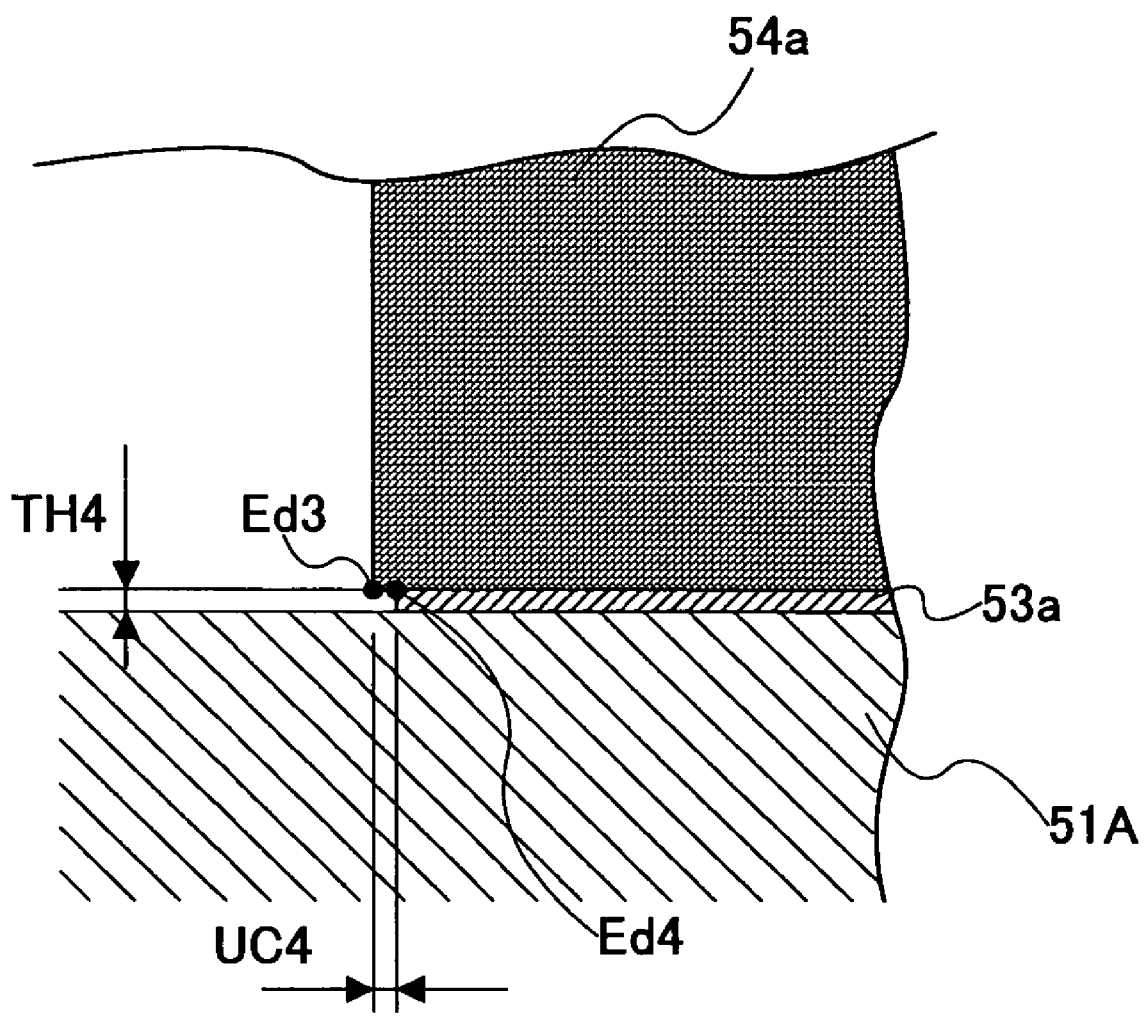
FIG. 14 is a diagram showing a part of the semiconductor device fabricated with the process of FIGS. 13A-13K with enlarged scale.

FIG. 14 shows a part of the gate insulation film 53a represented in FIG. 13K by "Y" with enlarged scale, wherein those parts of FIG. 14 explained previously are designated by the same reference numerals and the description thereof will be omitted.

Referring to FIG. 14, it should be noted that there is formed an undercut in the gate insulation film 53a with a recession UC4 defined equal to the distance from a side edge Ed3 of the gate electrode 54a to a lateral edge of the receded gate insulation film 53a, wherein the recession UC4 is generally equal to a thickness TH4 of the gate insulation film 53a.

With the present embodiment, the resistance of the gate insulation film 53a against the post processing conducted after etching process or against the chemical liquids used for removing the resist pattern is improved as a result of applying a thermal annealing process to the gate insulation film 53. Thereby, the problem of the gate insulation film 13a being excessively etched and excessive undercut is formed underneath the gate electrode 54a.

Thus, it becomes possible with the present embodiment to eliminate the operational problems of the semiconductor device 50 caused by the uncontrolled pattern shape of the gate insulation film 53a, and it becomes possible to form a highly miniaturized semiconductor device operating at high speed while using a high-K dielectric film for the gate insulation film.

Further, the present invention is not limited to these embodiments described heretofore, but various variations and modifications may be made without departing from the scope of the invention.

What is claimed is:

1. A method of fabricating a semiconductor device, comprising:
    a first step of forming an insulation film containing an oxide of Zr or Hf over a Si substrate;
    a second step of forming a gate electrode film over said insulation film;
    a third step of patterning said gate electrode film by an etching process,
    a fourth step of annealing, after said third step, said insulation film in a processing gas ambient containing $CCl_4$; and
    a fifth step of removing said insulation film applied with said annealing process,
    wherein said fourth step is conducted at a temperature of 400° C.-500° C.

2. The method as claimed in claim 1, wherein said fourth step forms a halide of Zr or Hf.

3. The method as claimed in claim 2, wherein said fifth step removes said halide by heating.

4. The method as claimed in claim 1, wherein said fifth step removes said halide by hydrolysis.

5. The method as claimed in claim 1, wherein said gate electrode film comprises polysilicon.

* * * * *